(12) United States Patent
Mattheis et al.

(10) Patent No.: US 10,962,386 B2
(45) Date of Patent: Mar. 30, 2021

(54) MAGNETIC REVOLUTION COUNTER AND METHOD FOR DETERMINING NUMBERS OF REVOLUTIONS THAT CAN BE DETERMINED BY MEANS OF SAID REVOLUTION COUNTER

(71) Applicants: Leibniz-Institut Fuer Photonische Technologien e.V., Jena (DE); Horst Siedle GmbH & Co. KG, Furtwangen (DE)

(72) Inventors: Roland Mattheis, Jena (DE); Marco Diegel, Jena (DE)

(73) Assignees: HORST SIEDLE GMBH & CO. KG, Furtwangen (DE); LEIBNIZ-INSTITUT FUER PHOTONISCHE TECHNOLOGIEN E.V., Jena (DE)

( * ) Notice: Subject to any disclaimer, the term of this patent is extended or adjusted under 35 U.S.C. 154(b) by 345 days.

(21) Appl. No.: 16/060,522

(22) PCT Filed: Dec. 7, 2016

(86) PCT No.: PCT/DE2016/000434
§ 371 (c)(1),
(2) Date: Jun. 8, 2018

(87) PCT Pub. No.: WO2017/097285
PCT Pub. Date: Jun. 15, 2017

(65) Prior Publication Data
US 2018/0372510 A1    Dec. 27, 2018

(30) Foreign Application Priority Data
Dec. 11, 2015   (DE) .......................... 102015016163.6

(51) Int. Cl.
*G01P 3/487*    (2006.01)
*G01R 33/09*    (2006.01)
(Continued)

(52) U.S. Cl.
CPC ............... *G01D 5/145* (2013.01); *G01B 7/30* (2013.01); *G01D 5/2449* (2013.01);
(Continued)

(58) Field of Classification Search
CPC ........ G01D 5/16; G01D 5/145; G01D 5/2033; G01D 5/24476; G01D 5/2449;
(Continued)

(56) References Cited

U.S. PATENT DOCUMENTS 6,998,839 B2 *  2/2006  Doescher ............... B82Y 25/00
                                                324/207.21
7,239,131 B2 *  7/2007  Halder ................... B62D 15/02
                                                324/207.21

(Continued)

FOREIGN PATENT DOCUMENTS

DE    102008037975 A1 *  3/2009  ......... G11C 19/0808
DE    10 2008 063226 A1    7/2010
(Continued)

*Primary Examiner* — Patrick Assouad
*Assistant Examiner* — Sean Curtis
(74) *Attorney, Agent, or Firm* — Norris McLaughlin, P.A.

(57) ABSTRACT

A magnetic revolution counter, and method for determining a predefinable number n of revolutions to be determined of a rotating magnetic field, generated by a magnetic system includes a revolution sensor, which includes magnetic domain wall conductors composed of open spirals or closed, multiply-wound loops, which are formed by a GMR layer stack or a soft magnetic layer comprising locally present TMR layer stacks and in which magnetic 180° domain walls can be introduced and located by measuring the electrical resistance of predefinable spiral or loop sections, wherein a
(Continued)

single domain wall is, or at least two magnetic domain walls are, introduced into the domain wall conductors such that the at least two domain walls are brought into a defined separation of greater than 360° with respect to one another, based on the change in location thereof from a first to a second position, with a rotation of the outer magnetic field by the angle of greater than 360°, and are permanently thus spaced apart from one another, and electrical contacts, which are disposed in a defined manner on the domain wall conductors, are provided.

16 Claims, 15 Drawing Sheets

(51) Int. Cl.
    *G01B 7/30*     (2006.01)
    *G01D 5/14*     (2006.01)
    *G01D 5/244*     (2006.01)

(52) U.S. Cl.
    CPC .......... *G01D 5/24476* (2013.01); *G01P 3/487* (2013.01); *G01R 33/093* (2013.01)

(58) Field of Classification Search
    CPC ......... G01D 3/022; G01P 3/487; G01P 3/488; G01P 13/04; G01R 33/093; G01R 33/098
    USPC ........................................ 324/207.21, 207.25
    See application file for complete search history.

(56) References Cited

U.S. PATENT DOCUMENTS

| | | | | |
|---|---|---|---|---|
| 7,557,567 B2 * | 7/2009 | Sakanoue | ............ | G01D 5/2451 |
| | | | | 324/207.21 |
| 7,671,583 B2 * | 3/2010 | Diegel | ................ | G01D 5/2033 |
| | | | | 324/207.21 |
| 8,179,130 B2 * | 5/2012 | Mattheis | ................ | G01D 5/145 |
| | | | | 324/207.25 |
| 9,958,511 B2 * | 5/2018 | Zimmer | ............... | G01R 33/096 |
| 10,228,267 B2 * | 3/2019 | Mattheis | ............... | G01R 33/093 |
| 10,415,998 B2 * | 9/2019 | Dietrich | ................... | G01D 5/16 |
| 10,505,482 B2 * | 12/2019 | Mori | ...................... | G01R 33/09 |
| 10,571,298 B2 * | 2/2020 | Tomida | .................. | G01R 33/06 |
| 10,634,516 B2 * | 4/2020 | Fujiura | ................ | G01R 15/205 |
| 10,670,386 B2 * | 6/2020 | Zimmer | ................... | G01B 7/30 |
| 10,759,276 B2 * | 9/2020 | Onaka | .................... | G01D 5/245 |
| 10,830,613 B2 * | 11/2020 | Tonge | ................... | G01D 5/145 |
| 10,859,404 B2 * | 12/2020 | Diegel | ................... | G01D 3/022 |
| 2005/0237054 A1 * | 10/2005 | Halder | .................... | G01D 5/14 |
| | | | | 324/207.21 |
| 2007/0285087 A1 * | 12/2007 | Diegel | ................... | G01P 3/487 |
| | | | | 324/207.25 |
| 2009/0027046 A1 * | 1/2009 | Sakanoue | ............... | G01P 13/04 |
| | | | | 324/207.22 |
| 2010/0301842 A1 * | 12/2010 | Mattheis | ............ | G11C 19/0808 |
| | | | | 324/207.25 |
| 2015/0130450 A1 | 5/2015 | Gehringer et al. | | |
| 2016/0161574 A1 * | 6/2016 | Zimmer | ............... | G01R 33/093 |
| | | | | 324/252 |
| 2016/0265941 A1 * | 9/2016 | Mattheis | ............... | G01R 33/098 |
| 2017/0261345 A1 * | 9/2017 | Schmitt | ................... | G01D 5/145 |
| 2018/0172477 A1 * | 6/2018 | Dietrich | .................. | G01D 5/16 |
| 2018/0356252 A1 * | 12/2018 | Diegel | ................... | G01P 3/487 |
| 2018/0372510 A1 * | 12/2018 | Mattheis | ............... | G01D 5/145 |
| 2019/0077256 A1 * | 3/2019 | Onaka | .................... | G01D 5/245 |
| 2019/0158007 A1 * | 5/2019 | Mori | ...................... | H02K 29/08 |
| 2019/0195613 A1 * | 6/2019 | Zimmer | .................. | G01B 7/30 |
| 2019/0257639 A1 * | 8/2019 | Tomida | ................ | B62D 15/021 |
| 2019/0257669 A1 * | 8/2019 | Fujiura | ................ | G01R 33/09 |
| 2019/0257671 A1 * | 8/2019 | Osabe | .................. | G01R 15/205 |
| 2019/0293455 A1 * | 9/2019 | Tonge | ................... | G01D 5/145 |
| 2019/0323819 A1 * | 10/2019 | Zimmer | ................... | G01D 5/12 |
| 2019/0383643 A1 * | 12/2019 | Schmitt | ................... | G01D 5/145 |
| 2019/0383645 A1 * | 12/2019 | Tonge | ................ | G01D 5/24476 |
| 2020/0158536 A1 * | 5/2020 | Tomida | .................. | G01R 33/07 |

FOREIGN PATENT DOCUMENTS

| | | | | |
|---|---|---|---|---|
| DE | 10 2010 010893 A1 | | 9/2010 | |
| DE | 10 2010 022611 A1 | | 12/2011 | |
| DE | 10 2011 075306 A1 | | 11/2012 | |
| DE | 10 2013 018680 A1 | | 5/2015 | |
| DE | 102017005562 A1 * | | 1/2018 | ............ G01D 5/145 |
| WO | WO-2004020952 A2 * | | 3/2004 | ............ B62D 15/02 |
| WO | WO-2005106395 A1 * | | 11/2005 | ............ G01P 3/487 |
| WO | 2013/164361 A1 | | 11/2013 | |
| WO | WO-2017097284 A1 * | | 6/2017 | ........ G01D 5/24476 |
| WO | WO-2017097285 A1 * | | 6/2017 | ............ G01P 3/487 |

* cited by examiner

| Winding | Revolution | 0 | 1 | 2 | 3 |
|---|---|---|---|---|---|
| | Field angle quadrant | 1 | 1 | 1 | 1 |
| Half bridge | Center contact (bottom) | | | | |
| W1 | 91 | L | H | H | H |
| W2 | 93 | L | L | H | H |
| W3 | 95 | H | L | L | H |
| W4 | 97 | H | H | L | L |
| W5 | 99 | H | H | H | L |

FIG. 9a

| Winding | Revolution | 0 | 1 | 2 | 3 |
|---|---|---|---|---|---|
| | Field angle quadrant | 2 | 2 | 2 | 2 |
| Half bridge | Center contact (bottom) | | | | |
| W1 | 91 | M | H | H | H |
| W2 | 93 | L | M | H | H |
| W3 | 95 | H | L | M | H |
| W4 | 97 | H | H | L | M |
| W5 | 99 | H | H | H | L |

FIG. 9b

| Winding | Revolution | 0 | 1 | 2 | 3 |
|---|---|---|---|---|---|
| | Field angle quadrant | 3 | 3 | 3 | 3 |
| Half bridge | Center contact (bottom) | | | | |
| W1 | 91 | H | H | H | H |
| W2 | 93 | L | H | H | H |
| W3 | 95 | H | L | H | H |
| W4 | 97 | H | H | L | H |
| W5 | 99 | H | H | H | L |

FIG. 9c

| Winding | Revolution | 0 | 1 | 2 | 3 |
|---|---|---|---|---|---|
| | Field angle quadrant | 4 | 4 | 4 | 4 |
| Half bridge | Center contact (bottom) | | | | |
| W1 | 91 | H | H | H | H |
| W2 | 93 | L | H | H | H |
| W3 | 95 | M | L | H | H |
| W4 | 97 | H | M | L | H |
| W5 | 99 | H | H | M | L |

MAGNETIC REVOLUTION COUNTER AND METHOD FOR DETERMINING NUMBERS OF REVOLUTIONS THAT CAN BE DETERMINED BY MEANS OF SAID REVOLUTION COUNTER

BACKGROUND OF THE INVENTION

The invention relates to a magnetic revolution counter, and to a method for determining numbers of revolutions of an outer magnetic field ascertainable by way of this revolution counter, which can advantageously be used in multifaceted fields of technology, and in particular in automotive engineering and transmission manufacturing, since such revolution counters can have a miniaturized design and be operated without current.

In principle, revolution counters for the non-contact and powerless counting of revolutions, using magnetic domain walls (DW), are known per se and described in detail, for example, in DE 10 2008 063 226 A1, DE 10 2010 022 611 A1, DE 10 2011 075 306 A1 and DE 10 2013 018 680 A1.

The revolution counters disclosed in the above documents have the following in common:

The sensor systems used are composed of at least one sensor element and at least one outer magnetic field, wherein either the sensor element is moved past the magnetic field or rotated, or the magnetic field is moved past the sensor element or rotated, in a non-contact manner. The sensor element at least partially has a layer composition, composed of at least one hard magnetic layer and at least one soft magnetic layer, these being separated by a non-magnetic layer. During operation of the sensor system, rotating or moving the magnetic field past the sensor element (or vice versa) can change only the magnetization of the soft magnetic layer, and not the magnetization of the hard magnetic layer. In this way, the magnetization of the soft magnetic layer in the sensor element will be oriented entirely or partially substantially parallel or substantially anti-parallel to the magnetization of the hard magnetic layer. This differing orientation of the magnetizations results in a difference in the electrical resistance in different conductor sections, which can be read out by way of the GMR (giant magnetoresistive) or TMR (tunnel magnetoresistive) effect.

Within the soft magnetic layer, two differently magnetized regions are separated from one another by a magnetic domain wall (DW).

During operation of the sensor system, a change in position of the outer magnetic field, for example due to rotation, in the sensor element results in a powerless movement of the magnetic domain walls that exist in the sensor element.

The read-out DW positions are assigned to bijectively determined revolutions (numbers of revolutions) ascertainable by way of the specific revolution counter, and are ascertained in evaluation electronics. In preferred embodiments, multiple sensor elements or multiple parts of a sensor element are electrically interconnected with one another to form Wheatstone bridges or Wheatstone half bridges, whereby the influence of the temperature on the magnetoresistive signal is suppressed.

The revolution counters according to DE 10 2008 063 226 A1 are geometrically formed by a rhombus-shaped spiral, which ends in a large surface area at one end. This large, preferably circular, surface area acts as a domain wall generator (DWG), and is formed of the same material layer combination as the spiral. After every 180° magnetic field rotation or 180° sensor element rotation, a so-called 180° domain wall is generated in this domain wall generator at the transition from the surface area to the spiral. This 180° DW migrates into the spiral. The generated 180° domain walls are transported to the spiral end with a direction of rotation of the magnetic field in the spiral direction of rotation, and the DW are transported toward the DWG with a direction of rotation opposite the spiral direction of rotation. In this process, the 180° DW arriving first at the DWG from the spiral annihilates with the 180° DW generated simultaneously in the DWG. By successive rotation of the magnetic field, the spiral can thus be incrementally deleted from domain walls. The movement of the sensor element to the magnetic system, which is mounted in a stationary manner, is equivalent to the rotation of the magnetic field at the stationary sensor element.

Revolution counters according to DE 10 2011 075 306 A1 are composed of two rhombus-shaped spirals comprising a respective DWG at each end having oppositely oriented directions of rotation, or of a combination of these two spirals comprising only one DWG at one end or in the center.

These revolution counters according to DE 10 2008 063 226 A1 and DE 10 2011 075 306 A1 have in common that, with each detected half revolution, the number of the 180° domain walls in each spiral changes by one.

This is different in the revolution counters that comprise at least one closed loop having at least one intersection (DE 10 2013 018 680 A1) or at least one closed loop having at least one bridge (DE 10 2010 022 611 A1). In these revolution counters, the two ends of a spiral were connected to one another to form a closed loop. With n windings, the direct connection intersects (n−1) windings. A two-turn spiral thus becomes a loop having one intersection, and a three-turn spiral becomes a loop having two intersections. Each winding can accommodate a maximum of two domain walls, so that a maximum of 2n domain walls can exist in a loop having n windings.

In a closed loop, no DW is generated or destroyed during regular counting operation. A destruction or generation of domain walls would result in a counting error and must be precluded. Revolution counters comprising at least one closed loop require an exact number of domain walls to be written to the sensor element during an initialization process.

Some embodiments of revolution counters comprising open spirals having DWG can be mechanically initialized. In a spiral having n windings, for example, this takes place by a movement of the sensor element or of the outer magnet of the sensor system by at least n revolutions, so as to fill the spiral completely with domain walls. A subsequent rotation in the opposite direction by n revolutions clears the spiral of domain walls. For applications counting clockwise and counterclockwise revolutions, the spiral is maximally filled with domain walls using n revolutions for an initialization in the center position, and thereafter is cleared except for n/2 domain walls using n/2 revolutions having the opposite direction of rotation.

In the revolution counters comprising closed loops, the initialization takes place, for example, by completely filling the closed loop with domain walls with the aid of a magnetic field pulse, the strength of which exceeds the nucleation field strength $H_{Nuk}$ of the loop, and by subsequently deleting domain walls. The deletion of domain walls takes place by the annihilation of two domain walls at a time. For this purpose, a DW is fixed (pinned) beneath a conductor by a current-induced field, referred to as the Oersted field $H_{Oersted}$, during a magnetic field rotation, and a further DW is transported toward the pinned DW due to the field rotation, whereby the two domain walls annihilate. If, for example, the DW is transported to the conductor by a magnetic field pointing to the left, the current-induced magnetic field must point to the right so as to be oriented opposite to the DW movement. If the counter field is sufficiently large, the DW movement stops at the conductor, and the DW is pinned. If the Oersted field is maintained for the next at least 180° of the magnetic field rotation, a second DW is thereby transported to the conductor. This second DW annihilates with the first pinned DW. By successively continuing to rotate the acting magnetic field and by current-induced DW pinning, in this way two DW at a time can be consecutively deleted from a closed loop until the desired predefinable number of domain walls for operating the sensor system has been reached.

All above-described revolution counters have in common that the counting of revolutions takes place in a powerless manner by transporting domain walls in closed loops, or by transporting and generating or destroying domain walls in open spirals. The counted revolutions are also stored in a powerless manner by way of bijective DW positions and/or DW numbers in the sensor element.

In contrast, power is required for reading out the sensor element. In preferred embodiments, the giant magneto resistance (GMR) effect or the tunneling magneto resistance (TMR) effect is utilized for this purpose, wherein multiple sensor elements or parts of a sensor element according to the known prior art are interconnected to form Wheatstone half bridges or Wheatstone bridges.

Depending on the magnetization, a sensor element has differing electrical resistances or differing potentials in different sections, which can be read out if the sensor element, or a part of the sensor element, is interconnected in Wheatstone half bridges or Wheatstone bridges. For reading out the magnetization state, a measuring current is conducted through the sensor element (or the Wheatstone (half) bridge), and the measurement result is compared to defined threshold values. Depending on whether a drop below a threshold value occurs or the threshold value is exceeded, a decision can be made as to whether or not the measurement result corresponds, for example, to the state "a DW is present in this half bridge."

In revolution counters according to DE 10 2008 063 226 A1, a rhombus shape having individual contacting of half windings in Wheatstone half bridges was introduced for the first time. This particularly advantageous design having a square shape uses four webs at a 90° angle with respect to one another per winding. Two respective webs are connected to one another by quarter circles or quarter circle-like polygonal lines. The quarter circles are covered with electrical contacts, which additionally cover parts of the abutting webs so that the non-contacted parts of all webs between the electrical contacts are preferably equal in length. The four webs of each winding are interconnected to form two Wheatstone half bridges. The reference direction is in the diagonal of the rhombus or of the square and is perpendicular to the line between the VCC contact and the GND contact. In this way, bijective assignment to the counted revolution number using only one square (rhombus-shaped) spiral is always possible for every field angle. As presented in the publication "IEEE Transactions on Magnetics, Vol. 45, No 10, pp 3792-3795, 2009," this allows bijective assignment of the magnetization to the counted revolution for all revolutions that can be counted by way of the sensor.

This geometry makes revolution counters having an ascertainable revolution number of n>10 possible. In the "RSM 2800" sensor system from Novotechnik, the technology of a square spiral for counting up to 16 revolutions is implemented.

All these revolution counters have in common that the field H of the magnet of the sensor system during operation must be located within a "magnetic window" between $H_{min}$ and $H_{max}$, wherein $H_{min}$ must be larger than the maximum depinning field $H_{depinn}$ and $H_{max}$ must be smaller than the nucleation field $H_{Nuk}$ of the sensor element:

$$H_{depinn} < H_{min} \leq H \leq H_{max} < H_{Nuk}$$

The maximum field $H_{max}$ and the minimum field $H_{min}$ are predefined by the application. All these revolution counters furthermore have in common that the sensor elements are suitably tested at the maximum field $H_{max}$ and the minimum field $H_{min}$ of the application regarding a certain error probability of less than $10^{-7}$, for example. Within this magnetic window, the domain walls are reliably transported.

To ensure a bijective assignment of the signals to the counted revolution number at all field angles, not all Wheatstone half bridges are read out in the case of the rhombus-shaped spiral comprising a DWG. It is sufficient here to consecutively read out all Wheatstone half bridges starting from the tip of the spiral until the winding is reached in which the first DW transported into the spiral is located. This is identified based on a level jump. However, it is absolutely essential in this regard to read out the respective half winding following the read-out Wheatstone half bridges, which is to say according to the state of the art the read-out always takes place with a 180° resolution.

It is advantageous that this sensor element is able to output half revolutions. The drawback, however, is that this necessitates contacting of all half bridges, such that a large chip surface is required, the size of which is thus essentially determined by the space requirement of the bond contacts, each of which requires space approximately on the order of magnitude of the actual sensor element.

The geometric areas in which the domain walls are located within the spiral or loop the majority of the time are hereafter referred to as domain wall positions (DW positions). In the case of square or rhombus-shaped spirals, these are the quarter circles or quarter circle-like polygonal lines connecting two respective straight webs to one another. For a DW to traverse a quarter circle, the outer magnetic field must be rotated by 90°, plus a hysteresis angle of typically 5° to 20°. As soon as the DW is transported to the transition from the quarter circle to the web, and the applied field depins the DW, the DW traverses the web at a speed of several 100 m/sec in a few 100 ns. Within this very short time, the rotation of the outer magnetic field is negligibly small.

There are four quarter circles per winding in the case of a square spiral (or a square loop), and thus four DW positions, which are covered with the electrical contacts of two Wheatstone half bridges. The VCC (higher voltage with respect to ground) contact is located above a DW position, the GND (ground) contact is located above the opposite DW position, and the two interposed DW positions are each covered with a center contact.

In all above-described revolution counters according to the known prior art, the DW positions contacted with a Wheatstone half bridge center contact have an angular separation of 180°.

By selecting the direction of the reference magnetization in the GMR layer stack, the Wheatstone half bridge is at the center potential when a DW in the DW position is positioned beneath the center contact, and it is at the high potential or at the low potential when the DW in the DW position is positioned beneath the VCC or the GND contact. The selection allows more variation for TMR layer stacks.

For each 180° magnetic field rotation, the domain walls stored in the sensor element are transported into the neighboring Wheatstone half bridge during error-free operation. In the revolution counters having a constant DW number, the DW arrangement thus shifts by the angular separation of 180° in the sensor element, and in the spiral comprising a DWG, additionally the number of the domain walls in the spiral changes by one DW. This movement is verified via the electrical read-out of the Wheatstone bridges or half bridges. Since the DW positions of two neighboring Wheatstone half bridges have an angular separation of 180° beneath the respective center contact, the read-out electronics thus uses a "180° read-out algorithm," which analyzes the revolutions using a 180° resolution, regardless of whether the read-out electronics outputs only integral revolution numbers or also half-integral revolution numbers. Reading out all Wheatstone half bridges requires all center contacts to be connected to bond contacts. This contacting pattern is referred hereafter as "180° contacting."

180° contacting is also used by the coprime sensor elements according to DE 102010022611 A1 and DE 10 2013 018 680 A1.

The crucial disadvantage of this 180° contacting is the required large chip surface of each sensor element so as to accommodate the necessary bond contacts, wherein, in particular in the case of revolution counters for numbers of revolutions greater than 10, the number of bond contacts decisively determines the chip surface, and thus the cost per chip.

The number of bond contacts can be reduced by a multiplexed power supply. In the case of a spiral including a domain wall generator (DWG) and 16 windings, a total of 34 contacts are required for a shared power supply of all 16 windings: one VCC contact, one GNG contact, and 16×2 center contacts for 32 Wheatstone half bridges. With quadruple multiplexing, in contrast, a total of only 16 contacts are ultimately required: four pairs of VCC and GNC contacts, and 4×2 center contacts, wherein each contact contacts four windings. By connecting the four VCC-GND pairs in rapid succession, the potentials of the four contacted windings can thus be individually consecutively read out at a center contact. In embodiments comprising a multiplexed power supply, not all Wheatstone half bridges are at the same potential, so that the potentials connected in parallel (here, of three windings or Wheatstone half bridges) can influence the measurement result during the measurement of a Wheatstone half bridge. In DE 10 2010 010 893 B4, revolution counters were combined with electrical circuits, which by way of reference bridges compensate for the effects that arise from the potentials connected in parallel. The advantageous connection using reference bridges requires an additional 17th contact for a spiral including a DWG and 16 windings.

SUMMARY OF THE INVENTION

It is the object of the present invention to provide a magnetic revolution counter, and a method for determining numbers of revolutions ascertainable by way of this revolution counter, which enable a further reduced number of bond contacts, thus allowing the revolution counter to be produced on smaller chip surfaces and thereby to be produced more cost-effectively.

The essence of the invention is that, initially, a magnetic revolution counter is provided for determining a predefinable number of revolutions to be determined of an outer magnetic field, generated by a rotating element, or a magnet wheel, or a linear magnetic scale;

comprising magnetic domain wall conductors, which are composed of open spirals or closed multiply-wound loops, which are formed by a GMR layer stack or a soft magnetic layer comprising locally present TMR layer stacks, and in which magnetic 180° domain walls can be introduced and located by measuring the electrical resistance of predefinable spiral or loop sections in keeping with the known prior art, wherein, according to the invention, however a single domain wall is, or at least two magnetic domain walls are, introduced into the domain wall conductors such that these, by way of means for generating, pinning or deleting, in a defined manner, domain walls, are brought into a defined separation of greater than 360° with respect to one another, based on the change in location thereof from a first to a second position, with a rotation of the rotating magnetic field by the angle of greater than 360°, and are thus permanently spaced apart from one another, and electrical contacts are provided on the domain wall conductors such that the domain wall conductors, located diagonally opposed, are captured by a respective VCC contact and GND contact collectively or in groups of multiple VCC and GND contacts for a multiplex read-out, and electrical contacts are provided solely on one side, based on the diagonal extending over the VCC contact and the GND contact, which contact a respective winding, or multiple windings in the case of a multiplex read-out, on each interposed domain wall conductor section substantially centered between the aforementioned VCC and GND contact(s), and the aforementioned contacts are interconnected to form separate Wheatstone half bridges, which can preferably be read out simultaneously or, in the case of a multiplex read-out, in rapid succession, essentially simultaneously, wherein the resistance conditions ascertained by the Wheatstone half bridges are all stored as a signal level in a memory in tabular form, which for the determination of the present revolution number is continuously compared to tabular target value patterns which are stored in a further memory and correspond to the specific revolution number.

As an alternative to reading out the sensor element by way of potential measurements using an interconnection into Wheatstone bridges, the invention also provides for reading out the sensor element by measuring the (TMR) resistances of all windings. For this purpose, either each individual winding is contacted with a respective GND contact and a respective VCC contact or, in preferred embodiments using a multiplex read-out, is contacted with a shared GND contact and a respective VCC contact on each winding, or with a shared VCC contact and a respective GND contact on each winding. The GND and VCC contacts are preferably disposed diagonally opposed. FIG. 14 shows one embodiment of this interconnection. The ascertained resistances here, similarly to the interconnection using Wheatstone half bridges, are all stored as a signal level in a memory in tabular form, which for the determination of the present revolution number is continuously compared to tabular target value patterns which are stored in a further memory and correspond to the specific revolution number.

Corresponding to the prior art, preferred embodiments comprise a rotation angle sensor (or a quadrant sensor), so as to, by preselecting a field angle quadrant, compare the measured values only to those target value patterns that are tied to the measured field angle quadrant. This reduces the number of the maximum required comparisons to one quarter, thereby speeding up the determination of the revolution number.

The number of the maximum required comparisons for the determination of the revolution number is furthermore kept low in that, during regular counting operation, the DW number remains constant, whereby only exactly one possible signal pattern exists per revolution and field angle quadrant, and thus also only one target value pattern must be stored in each case for comparison.

According to the present invention, the open spirals or the closed, multiply-wound loops forming the domain wall conductors have a substantially rhombus-shaped design, wherein the aforementioned contacts capture the corner regions of the rhombuses. Furthermore, the defined separation is preferably established at 540° when using two neighboring domain walls.

Instead of using GMR layer stacks, it is also possible, according to the invention, for the domain wall conductors to be made of a soft magnetic material, such as permalloy, and for the VCC and GND contacts to be placed on the TMR layer stack, which are provided on the domain wall conductors, for example in the center. The electrical center contacts, in contrast, contact the soft magnetic domain wall conductor directly in the corner regions of the rhombuses here as well.

The essence of the method used for determining the revolution numbers is that the determination of the counted revolution takes place by way of a processing unit, which carries out a comparison of the signals of all read-out Wheatstone half bridges (or the resistances of all windings in the case of resistance measurement) using a stored table, in which the respective signals of the Wheatstone half bridges (or the resistances of all windings) are stored for each countable revolution. This means that the counted revolution output by the processing unit is that in which the pattern from the measured signal voltages from winding 1 to winding n of the open spirals or closed, multiply-wound loops agrees with a stored signal pattern for winding 1 to winding n. Due to the 90° angles in the preferred embodiments comprising a square spiral or closed square loop, the potential changes after a respective 90° field rotation so that, at least for each 90° field angle range (field angle quadrant), a corresponding target value pattern is stored, which is selected with the measured value from the angle sensor (or quadrant sensor) for the comparison to the revolution counter signals.

The magnetization patterns impressed into the loops or spirals thus enable a bijective determination of the counted revolutions even with a permissible hysteresis of ±45°. For operating safety reasons, the field strengths selected (such as 120% of $H_{min}$) will always be strengths at which the actual hysteresis is always considerably smaller than ±30°.

The arrangement according to the invention of the electrical center contacts on one side of the rhombus-shaped sensor elements, or on one side based on the diagonal connecting the VCC contact and the GND contact, is hereafter referred to as 360° contacting since the revolution number counted with the sensor element and stored in the sensor element is read out using a 360° resolution. According to the invention, the same magnetization patterns (MP) can be initialized in the spiral-shaped or loop-shaped sensor elements. The preferred MP for the 360° contacting includes two domain walls having an angular separation of 540° with respect to one another, which enables a bijective determination of the counted revolution number and is easy to initialize, as will be described in more detail in the following specific description. A further MP according to the invention comprises only a single DW, which is written into spirals that are likewise according to the invention having two pointed open ends, wherein this spiral is likewise provided with the above-mentioned 360° contacting, as will be described in more detail in the following specific description regarding this embodiment.

BRIEF DESCRIPTION OF THE DRAWINGS

The following advantageous exemplary embodiments and figures are intended to provide a more detailed description of the above and of the invention, without thereby limiting the invention. In the drawings:

FIG. 9 shows signal level sequences, obtained from the provided 360° Wheatstone contacts for four exemplary quadrants according to FIGS. 7 and 8;

Embodiments according to the invention of revolution counters having the 360° contacting according to the invention are described hereafter based on accompanying figures, and allow a bijective read-out of integral revolution numbers at any field angle.

Figure 1:
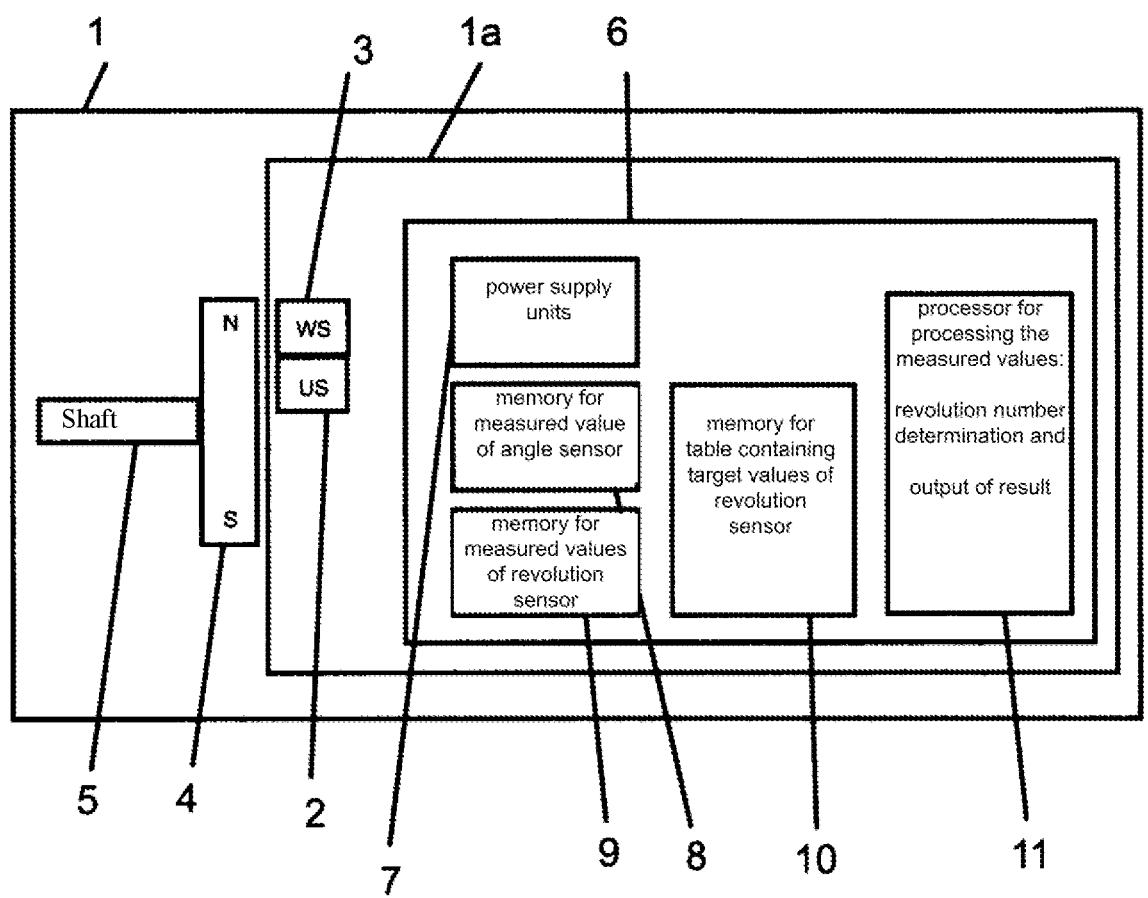
FIG. 1 shows the essential components of a revolution counter according to the present invention.

First, FIG. 1 shows the essential components of such a revolution counter system 1 comprising a revolution counter 1a according to the invention and a magnetic system 4 having a magnetic north (N) and a magnetic south (S) mounted to a rotating shaft 5. The revolution counter 1a comprises the following main components: a revolution sensor US 2, a 360° angle sensor WS 3, and electronics 6. The sensors 2 and 3 are mounted in a stationary manner and detect the angular position and the number of revolutions of the rotating magnetic field. The electronics 6 includes power supply units 7 for the sensor 2 and 3 and for processing the measured values, a memory 8 for the measured values of the angle sensor 3 and a memory 9 for the measured values of the revolution sensor 2, a memory 10 for target values of the revolution sensor 2 stored in tabular form, and a processing unit 11, which compares the measured values from the memories 8 and 9 to the tabular values of the memory 10 and outputs the result of each measurement.

The first special characteristic of the present invention is the design according to the invention of the revolution sensor 2, which will be described based on an exemplary and simplified illustration in FIG. 2. In particular, the design according to the invention with respect to the new manner of the contact connection will be described here.

In this example, the sensor element 2 is formed by a three-turn, square spiral 20 having pointed ends. The one tip 21 is the end of the outer winding, and the other tip 22 is the end of the innermost winding. In the example, corresponding to the known prior art, the spiral is composed of a magnetic layer stack, which exhibits the GMR effect. The reference direction 28 is diagonal with respect to the square windings. The first, outermost winding is composed of webs 31, 32, 33 and 34, the second, center winding is composed of webs 41, 42, 43 and 44, and the third, innermost winding is composed of webs 51, 52, 53 and 54. Each of the aforementioned webs is positioned at an angle of 90° with respect to the respective neighboring, adjoining web. Solely for the purpose of illustration of the actual conditions, it is shown that the connections between the webs are quarter circles or quarter circle-like polygonal lines 302 (shown in the zoomed-in circle 301), which are composed of the same layer stack as the webs. These polygonal lines form the "corners" of the square spiral, while also forming the above-mentioned domain wall positions (DW positions). Domain walls for large field angle ranges of the outer rotating magnetic field, according to FIG. 1 generated by the magnetic system 4, remain in the DW positions. So as to transport a DW through a quarter circle, the outer magnetic field must rotate by 90°, plus a hysteresis angle of typically 5° to 20°. During the transport through a web, there is basically almost no rotation of the magnetic field since the DW traverses the webs at several 100 m/sec. Accordingly, the DW moves from one quarter circle to the next quarter circle within less than 100 ns. From a time perspective, the domain walls thus essentially remain the entire time in the DW positions. The first, outermost winding thus includes the DW positions 35, 36, 37 and 38, the second winding includes the DW positions 45, 46, 47 and 48, and the third winding includes the DW positions 55, 56, 57 and 58.

Figure 2:
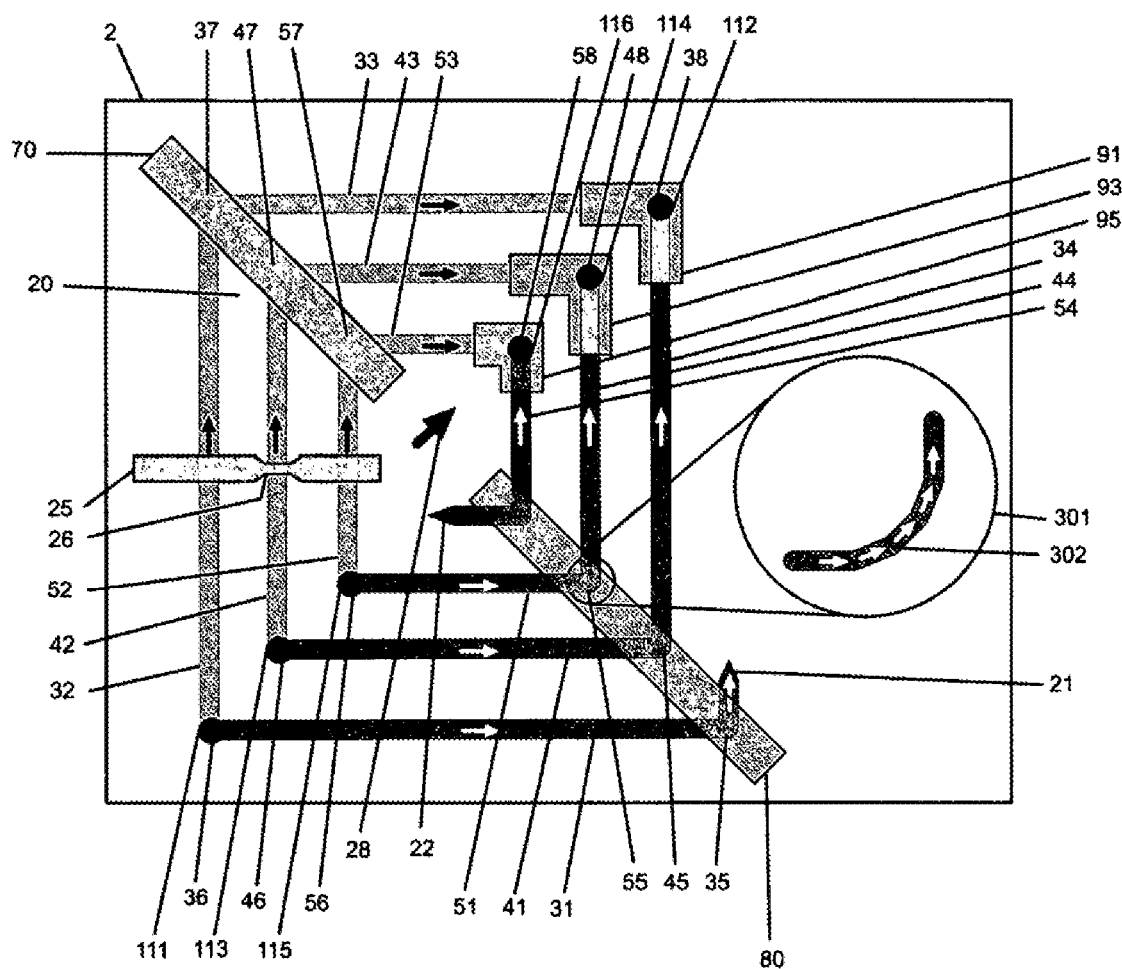
FIG. 2 shows a first general example of the design of the required sensor element having the contact arrangement according to the invention.

The exemplary spiral is provided with electrical contacts, and more particularly with a shared GND contact 70 at the top left, a shared VCC contact 80 at the bottom right, and according to the invention exclusively three center contacts 91, 93 and 95 in FIG. 2 at the top right. According to the claim, this means on a spiral half, which is formed by an imaginary diagonal extending through the VCC and GND contacts. FIG. 2 furthermore shows a conductor 25 having a constriction 26 for initializing the sensor element. The magnetization state of the sensor element 2 is read out by way of potential measurement and interconnection to form three Wheatstone half bridges: The Wheatstone half bridge W1 is formed by the webs 33 and 34 together with the center contact 91, the GND contact 70 and the VCC contact 80.

The Wheatstone half bridge W2 is formed by the webs 43 and 44 together with the center contact 93, the GND contact 70 and the VCC contact 80.

The Wheatstone half bridge W3 is formed by the webs 53 and 54 together with the center contact 95, the GND contact 70 and the VCC contact 80.

Initially, the sensor element 2 according to FIG. 2 is to be completely filled with six domain walls (black circles), which were generated, for example, following a field pulse having a field strength exceeding the nucleation field strength of the sensor element 2 in the direction of the magnetization of the reference direction 28.

In the first, outermost winding, the DW 111 is located in the DW position 36, and the DW 112 is located in the DW position 38.

In the second, center winding, the DW 113 is located in the DW position 46, and the DW 114 is located in the DW position 48.

In the third, innermost winding, the DW 115 is located in the DW position 56, and the DW 116 is located in the DW position 58.

The aforementioned three half bridges are at the center potential due to these DW positions and the position of the reference direction 28. The magnetization direction in the cw direction is shown in dark gray, and the magnetization direction in the ccw direction is shown in light gray. Additionally, the magnetization direction is identified in each web by a arrow. The reference direction 28 of the GMR layer stack is diagonal with respect to the square spiral and, in the example, is oriented from the bottom left to the top right.

So as to achieve the proviso underlying the present invention of a defined separation for two neighboring domain walls of >360°, at least two DW still have to be deleted. This will be described hereafter based on FIGS. 3a, 3b.

For the sake of clarity, the spiral shown in FIG. 2 includes only three windings. Actual sensor elements typically include ten to thirty such windings if a spiral design is selected.

Figure 3A:
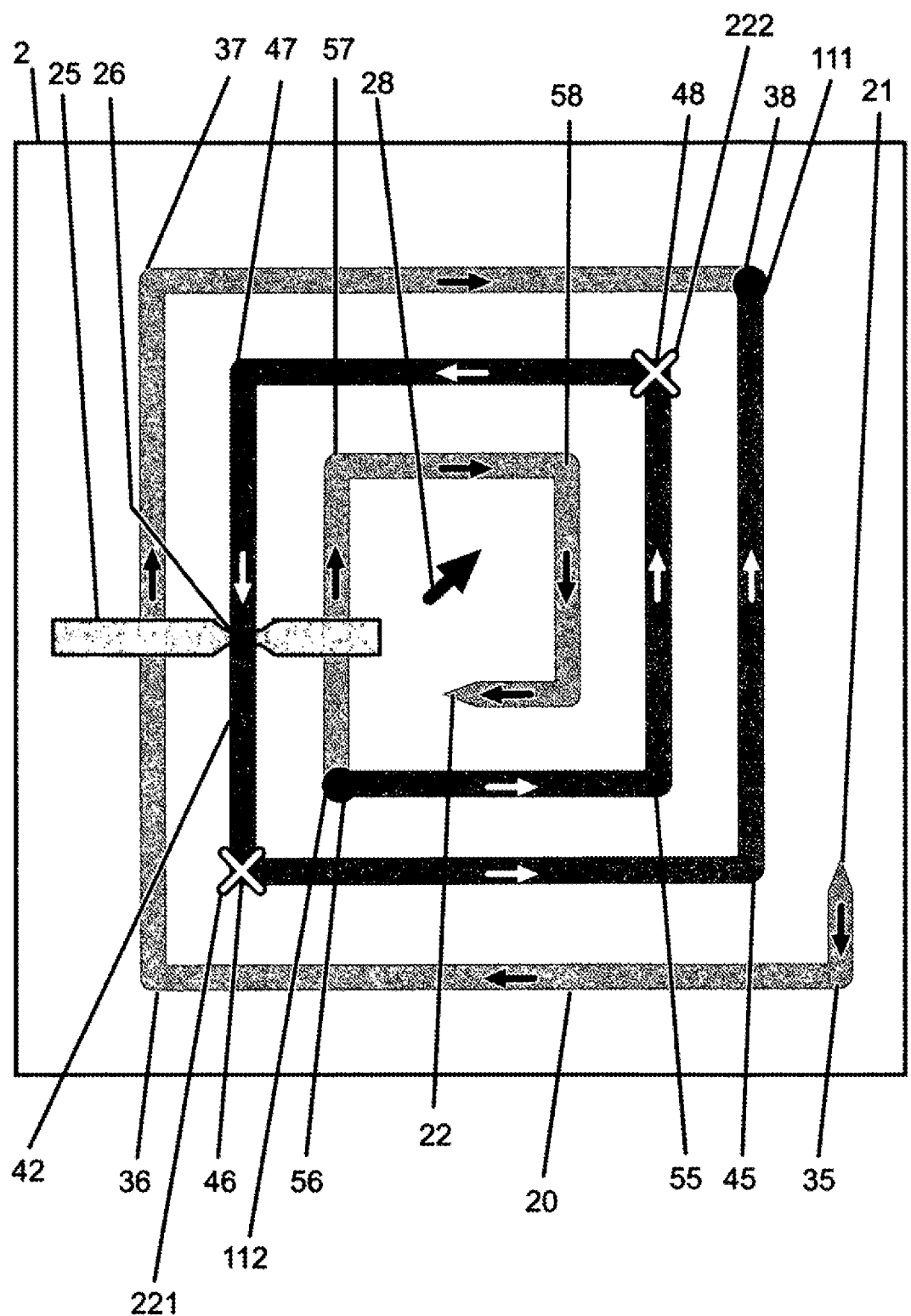
FIG. 3a shows the writing-in of a preferred provided magnetization pattern according to the invention based on FIG. 2.

With reference to FIG. 2, FIG. 3a shows the sensor element 2 in which a magnetization pattern having 540° angular separation between two neighboring domain walls was initialized, which enables 360° contacting according to FIG. 2 for bijective revolution counting. While full occupancy of the spiral with domain walls is not suitable for bijective revolution counting with the provided contacting, an option for initializing a magnetization pattern that is required according to the invention shall be described in slightly greater detail based on FIG. 3a, which takes place in six steps:

1. Prior to installing the sensor system for counting n revolutions (three revolutions in the example here), a mechanical end stop, which is not shown here, is unlocked, and the outer magnetic field is rotated n+1 revolutions (four here) in the ccw direction, whereby all potentially present domain walls, or the six domain walls shown in FIG. 2, leave the spiral via the tip 21. Thereafter, the sensor element is rotated into the desired zero position (the center position here for counting n/2 revolutions in the cw direction and n/2 revolutions in the ccw direction), and the end stop is locked.
2. This is followed by the nucleation of two domain walls by way of a current flow over a conductor 25 in the winding beneath the constriction 26. The current-induced Oersted field is above the nucleation field strength of the sensor element 2. The nucleated two domain walls are transported by the magnetic field of the magnet 4 oriented in the reference direction 28 (corresponding to FIG. 1) into the DW position 46 and into the DW position 48.
3. When the flow of current through the conductor 25 is deactivated, the outer magnetic field is rotated by 360° in the ccw direction, whereby the two nucleated DW are transported out of the DW position 46 into the DW position 36, and out of the DW position 48 into the DW position 38.
4. This is again followed by the nucleation of two domain walls by way of current flow over the conductor 25 in the winding beneath the constriction 26. The current-induced Oersted field is above the nucleation field strength of the sensor element 2. One DW is transported into the DW position 46, and the other DW is transported into the DW position 48 by the magnetic field of the magnet 4 pointing in the reference direction 28 (corresponding to FIG. 1).
5. The flow of current through the conductor 25 is reduced until, beneath the constriction 26, the resulting magnetic field of the sensor system and of the Oersted field (which is present parallel to the web 42 and points to the DW position 46) is below the minimum movement field strength of the sensor element. By way of a 270° cw rotation, the DW is transported out of the DW position 46, and the DW is transported out of the DW position 38 to the constriction 26, where they annihilate. At the same time, the DW is transported out of the DW position 36 into the DW position 45, and the DW is transported out of the DW position 48 into the DW position 57.
6. After the Oersted field has been deactivated, a 90° ccw rotation takes place, whereby the DW is transported out of the DW position 45 into the DW position 38, and the DW is transported out of the DW position 57 into the DW position 56. These domain walls are denoted as DW 111 (in the DW position 38) and as DW 112 (in the DW position 56) FIGS. 3a, 3b. The DW gaps DWL 221 and DWL 222 that arose are denoted by a cross.

As required within the scope of the invention, the two domain walls 111 and 112 provided in this example are spaced apart from one another by 540°, based on a cw rotation of the outer magnetic field.

Figure 3B:
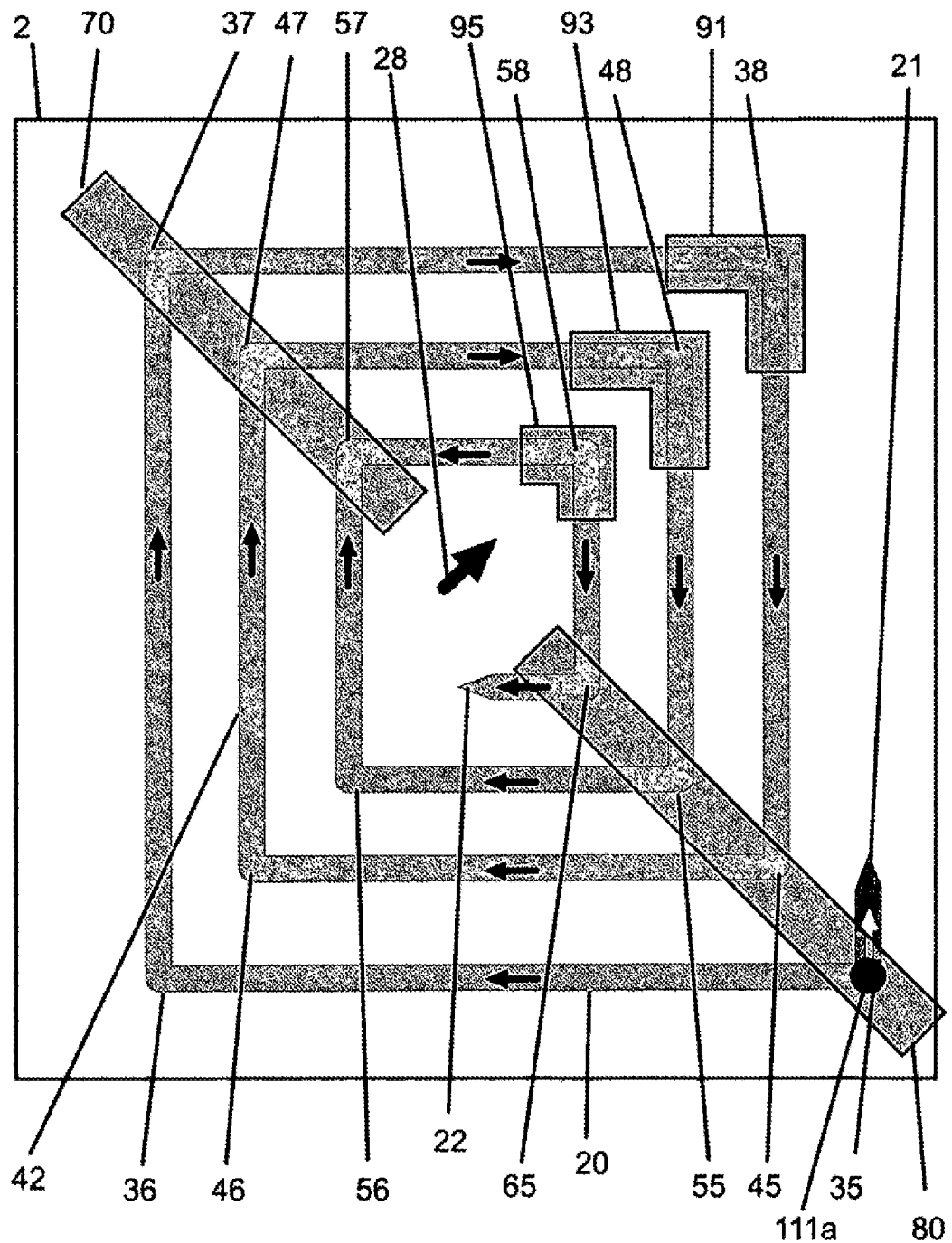
FIG. 3b shows the writing-in of a likewise possible magnetization pattern according to the invention based on FIG. 2, comprising only one domain wall.

In a further embodiment of the invention, FIG. 3b shows the sensor element according to FIG. 2, which has a magnetization pattern including only a single domain wall. The domain wall conductor of the spiral 20 shown in FIG. 3b is identical to the domain wall conductor illustrated in FIG. 3a. The 360° contacting shown in FIG. 3b, comprising the GND contact 70, the VCC contact 80 and the center contacts 91, 93 and 95 is identical to the 360° contacting according to FIG. 2. In contrast to the designs according to FIGS. 2 and 3a, the conductor 25 comprising the constriction 26 is not required for initializing the magnetization pattern MP using a single DW in the example according to FIG. 3b. The initialization takes place in four steps, for example, in this example:

1. Prior to installing the sensor system for counting n revolutions (three revolutions in the example here), the sensor element is exposed to a magnetic field that is above the nucleation field strength and, for example, points in the direction of the reference magnetization 28. As a result, two DW nucleate in each winding, which assume the DW positions located on the diagonal from the bottom left to the top right. These DW positions (six here) are already shown in FIG. 2.
2. Thereafter, the mechanical end stop, which is not shown here, is unlocked, and the outer magnetic field (of the magnet 4 shown in FIG. 1) is rotated by 270° in the cw direction. In this way, the DW 116 shown in FIG. 2 and positioned in the DW position 58 leaves the spiral via the tip 22. At the same time, the DW 115 shown in FIG. 2 is transported out of the DW position 56 and into the DW position 65, so as to be positioned in front of the last straight segment comprising the tip 22.
3. By way of three ccw rotations, the DW is positioned out of the DW position 65 and into the DW position 35, wherein during this transport all domain walls positioned in front of this DW successively leave the spiral via the tip 21. When the DW is positioned in the DW position 35, it is the only DW remaining in the spiral. This DW is referred to as DW 111a in FIG. 3b.
4. This DW 111a is subsequently transported into the zero position of the sensor element. When the zero position is the DW position 35 (for counting three cw revolutions), the initialization is concluded by locking the end stop. When the zero position is the DW position 47 for counting 1.5 revolutions in the cw direction and 1.5 revolutions in the ccw direction, the DW 111a is transported with 1.5 cw revolutions out of the DW position 35 and into the DW position 47, and the end stop is locked. For counting three ccw revolutions, the DW 111a is transported with three cw revolutions out of the DW position 35 and into the DW position 65.

The advantage of the design according to FIG. 3b is that the conductor 25, and thus the associated two bond contacts, are dispensed with. The disadvantage, however, is the purely mechanical initialization, which must take place with high angular precision. Mispositioning during the DW nucleation and/or during the rotation of the spiral until cleared may easily cause either all DW to leave the spiral, whereby revolution counting is not possible, or two domain walls having an angular separation of 180° with respect to one another, instead of one DW, to remain in the spiral, whereby bijective revolution counting is not possible. In principle, however, a design according to FIG. 3b is possible, including with provided numbers of windings that are higher than those cited in the example. The means to be provided within the scope of the invention for generating or, in a defined manner, deleting domain walls in this embodiment are formed by an outer magnetic field, which during the DW generation has a field strength above the nucleation field strength, and the mechanical means for driving out undesirable domain walls from the spiral which is open at both ends.

Figure 4:
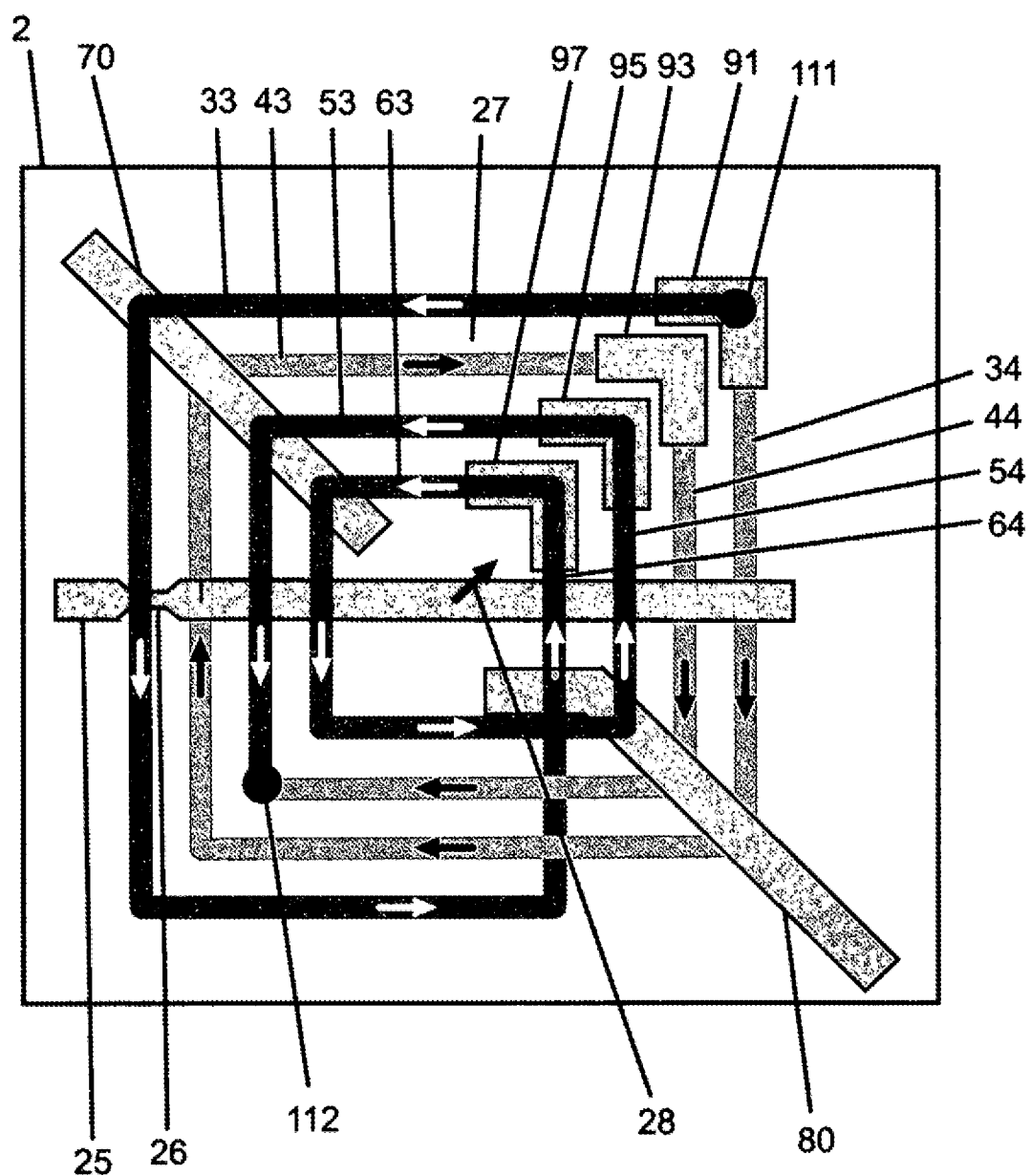
FIG. 4 shows a second general example of the design of the required sensor element having a contact arrangement according to the invention.

A second general exemplary embodiment according to FIG. 4 shall serve to demonstrate the multivalency of the designs of the revolution sensor 2 used within the scope of the invention, regarding domain wall conductors used.

FIG. 4 shows a further general design according to the invention of a revolution sensor 2, composed of a four-turn, closed loop 27 here. A magnetization pattern including the two domain walls DW 111 and DW 112 having an angular separation of 540° was initialized by way of the conductor 25 comprising the constriction 26. The reference direction 28 of the GMR layer stack forming the loop 27 is diagonal with respect to the square spiral and points from the bottom left to the top right. Electrical contact with this loop is made analogously to the spiral in FIG. 2 by way of a shared GND contact 70, a shared VCC contact 80 and four center contacts 91, 93, 95 and 97, which are located in a half at the top right above the diagonal between the VCC contact and the GND contact.

The magnetization state of the sensor element is again read out by way of potential measurement using four Wheatstone half bridges:

The Wheatstone half bridge WHB1 is formed by the webs 33 and 34 together with the center contact 91, the GND contact 70 and the VCC contact 80.

The Wheatstone half bridge WHB2 is formed by the webs 43 and 44 together with the center contact 93, the GND contact 70 and the VCC contact 80.

The Wheatstone half bridge WHB3 is formed by the webs 53 and 54 together with the center contact 95, the GND contact 70 and the VCC contact 80.

The Wheatstone half bridge WHB4 is formed by the webs 63 and 64 together with the center contact 97, the GND contact 70 and the VCC contact 80.

Each winding is connected to a Wheatstone half bridge.

In this example as well, the separation between the two neighboring domain walls DW 111 and DW 112 is 540°, as viewed in the cw direction.

Figure 5:
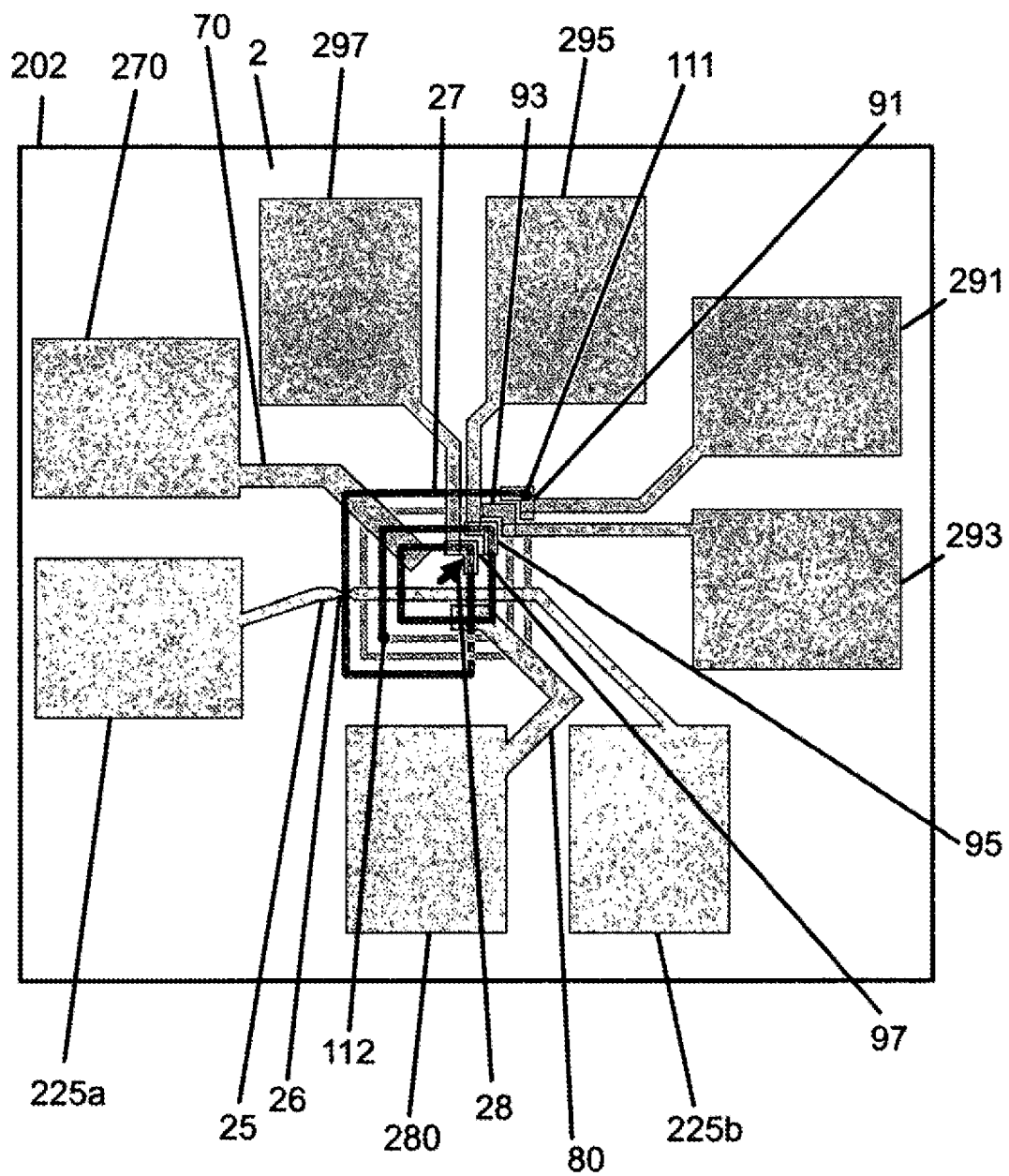
FIG. 5 shows an example of the achieved bond contact savings based on FIG. 4 in a more complete view of the chip in the revolution sensor.

FIG. 5 shows an example of the reduction in bond contacts sought according to the object and achieved, based on FIG. 4, in a more complete view of the chip in the revolution sensor. FIG. 5 shows the revolution sensor 2 from FIG. 4 on a chip 202 comprising bond contacts. The reference direction 28 of the GMR layer stack is diagonal with respect to the square spiral and points from the bottom left to the top right. The bond contact 270 connects the GND contact 70, the bond contact 291 connects the center contact 91, the bond contact 293 connects the center contact 93, the bond contact 295 connects the center contact 95, the bond contact 297 connects the center contact 97, the bond contact 280 connects the VCC contact 80, the bond contacts 225a and 225b connect the ends of the conductor 25 to the constriction 26. The size and number of the bond contacts essentially determine the chip size. Due to the 360° contacting according to the invention, four bond contacts were saved in this example. This effect becomes more apparent when a higher number of windings is provided in the sensor 2 for counting larger revolution numbers. In a revolution counter for 30 revolutions, only a maximum of 32 bond contacts (VCC+GND+30 center contacts) are required with the new kind of contacting, which is to say the "360° contacting" according to the invention, instead of 62 bond contacts, as was required heretofore according to the prior art (namely: VCC+GND+60 center contacts), and with 5×multiplexing only 16 (namely: 5 VCC+5 GND+6 center contacts) instead of 22 bond contacts (namely: 5 VCC+5 GND+12 center contacts) are required. The multiplex readout of the Wheatstone half bridge signals, which is not described in more detail here, takes place successively using a clock frequency in the MHz range, while the measuring intervals are in the kHz range, and essentially simultaneous. This is accompanied by a reduction in the bond contacts to 48% or 27%, respectively. Since the chip surface is essentially determined by the size and the number of the bond contacts connected to the spiral contacts, this minimizes the chip surface per sensor element by 25% or 10%, respectively, as was ascertained by way of example based on layout simulations.

Figure 6:
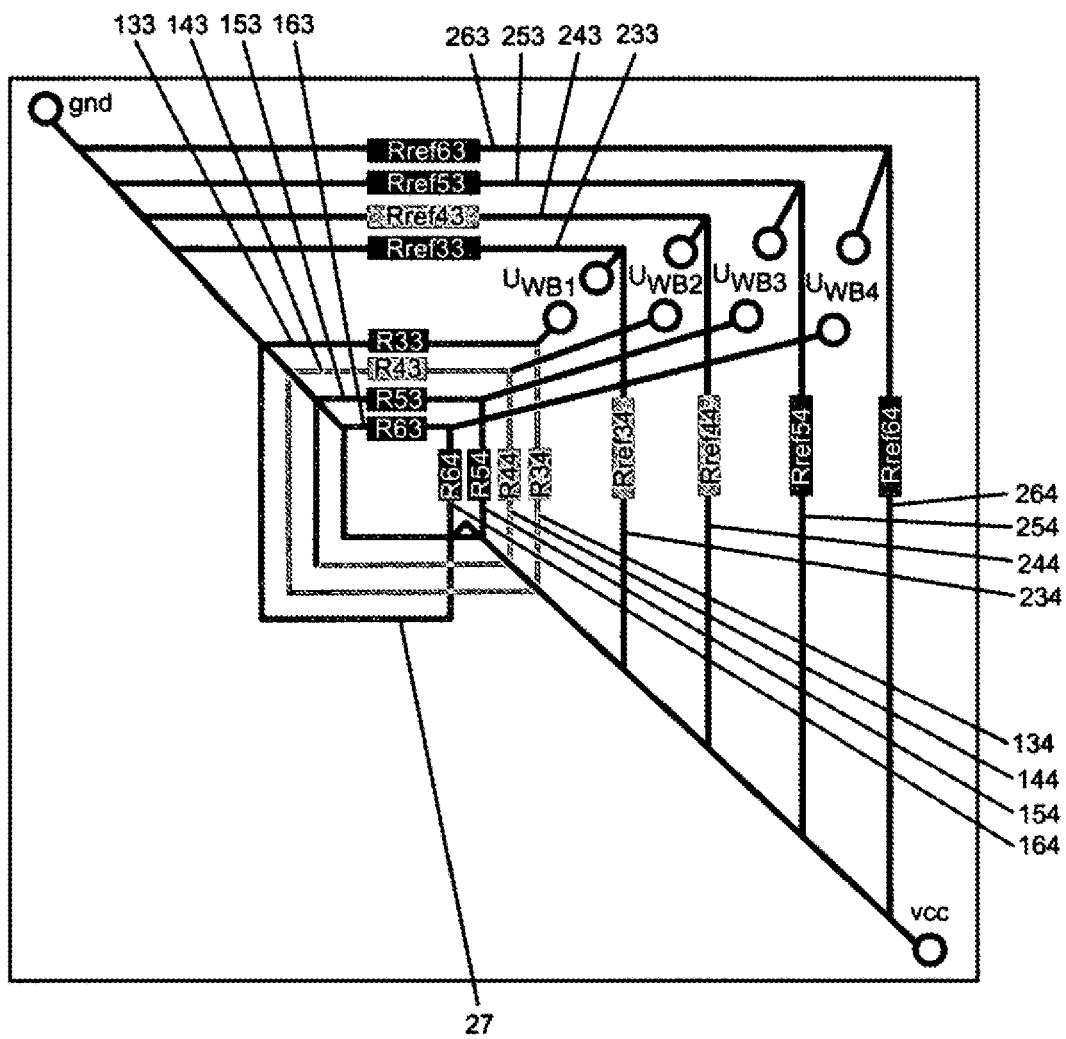
FIG. 6 shows the interconnection of the contacts that are provided according to the invention and disposed on the revolution sensor for forming Wheatstone bridges according to the example of FIG. 4.

FIG. 6 shows the interconnection of the revolution sensor 2 according to FIGS. 4 and 5 to form four Wheatstone bridges WB1 to WB4, wherein the web resistors were numbered with Rij, according to the web numbers used in FIG. 2. The web resistors form a Wheatstone half bridge. To yield a Wheatstone full bridge, these web resistors are interconnected, for example, with two additional fixed resistors, which are external and not contained in the sensor element and which are not magnetoresistive and provided with the addendum "ref" for reference resistor in FIG. 6.

The Wheatstone bridge WB1 is composed of the resistors 133 (R33), 134 (R34), 233 (Rref33) and 234 (Rref34). The resistors 133 and 134 are webs from the first, outermost winding of the loop 27. The reference resistors 233 and 234 are fixed resistors located outside the sensor element.

The Wheatstone bridge WB2 is composed of the resistors 143 (R43), 144 (R44), 243 (Rref43) and 244 (Rref44). The resistors 143 and 144 are webs from the second winding of the loop 27. The reference resistors 243 and 244 are fixed resistors located outside the sensor element.

The Wheatstone bridge WB3 is composed of the resistors 153 (R53), 154 (R54), 253 (Rref53) and 254 (Rref54). The resistors 153 and 154 are webs from the third winding of the loop 27. The reference resistors 253 and 254 are fixed resistors located outside the sensor element.

The Wheatstone bridge WB4 is composed of the resistors 163 (R63), 164 (R64), 263 (Rref63) and 264 (Rref64). The resistors 163 and 164 are webs from the fourth, innermost winding of the loop 27. The reference resistors 263 and 264 are fixed resistors located outside the sensor element.

As in all other examples, within the scope of the invention the signal levels of all Wheatstone bridges are now detected essentially simultaneously and stored continuously in a memory 9 in tabular form, and are thus available for the subsequent comparison to the target values stored for the quadrants in the memory 10.

Figure 7:
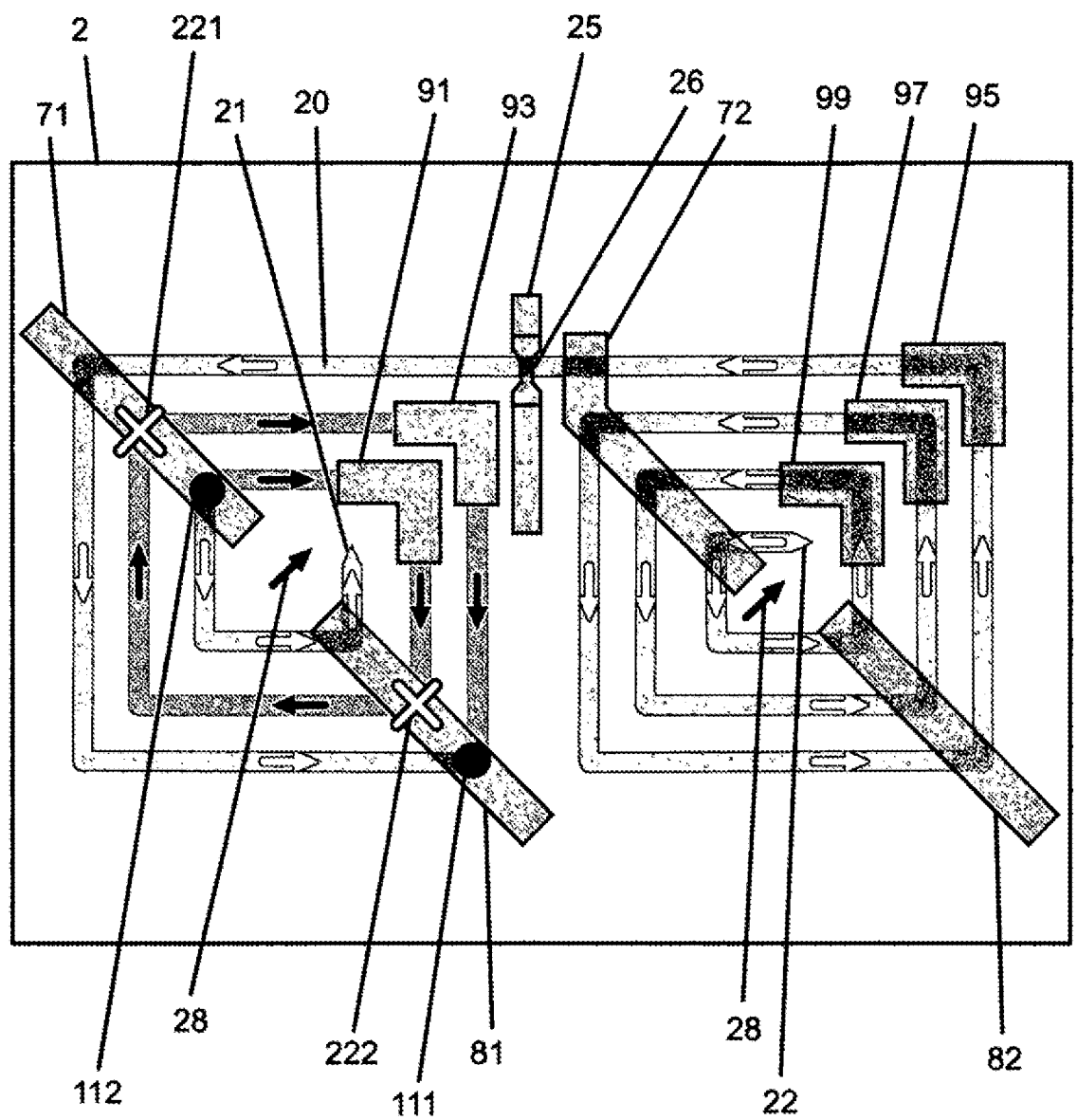
FIG. 7 shows a third general example of the design of the required sensor element having the contact arrangement according to the invention and a starting domain wall position.

A third general exemplary embodiment of the invention is shown in FIG. 7. FIG. 7 shows a revolution sensor 2, composed of a spiral 20 formed of two approximately equally sized sub-spirals having the same direction of rotation. The ends of the spiral are formed by the tips 21 and 22 in this example. The reference direction 28 of the GMR layer stack is oriented diagonally with respect to the square spiral and points from the bottom left to the top right (see arrow at the center of the spiral). The spiral in this example is read out electrically using five Wheatstone half bridges WHB1 to WHB5:

WHB1 comprising the webs between the GND contact 71, the center contact 91 and the VCC contact 81 (winding 1);

WHB2 comprising the webs between the GND contact 71, the center contact 93 and the VCC contact 81 (winding 2);

WHB3 comprising the webs between the GND contact 72, the center contact 95 and the VCC contact 82 (winding 3);

WHB4 comprising the webs between the GND contact 72, the center contact 97 and the VCC contact 82 (winding 4);

WHB5 comprising the webs between the GND contact 72, the center contact 99 and the VCC contact 82 (winding 5).

In the example, a magnetization pattern including two domain walls having an angular separation of 540°, as was already described, were initialized via the electrical contact 25 comprising the constriction 26. The positions of the domain walls DW 111 and DW 112 shall represent the revolution number zero in this example. Two DW gaps DWL 221 and DWL 222 are present between the DW 111 and the DW 112, which arose due to the annihilation of two domain walls, so that a separation of >360°, again 540° here, is set between the neighboring domain walls DW 111 and DW 112 in the cw direction.

The magnetization direction of the webs in the WHB1 and the WHB2 is ccw, and that of the webs in the WHB3, the WHB4 and the WHB5 is cw. Due to the reference direction 28 of the GMR layer stack, the signal levels of the five Wheatstone half bridges in the example are:

WHB1 (winding 1): L
WHB2 (winding 2): L
WHB3 (winding 3): H
WHB4 (winding 4): H
WHB5 (winding 5): H The processing unit 11 processes all measured signal levels of the five half bridges simultaneously, for example as a signal level sequence (SLS) from winding 1 to winding 5, and compares these to target values stored in the memory 10. The SLS for FIG. 7 in the illustrated example is: L/L/H/H/H. What is decisive for the detection of the counted revolutions is the portion of the SLS which correlates with the magnetization pattern MP, which is to say with the positions of the DW 111 and the DW 112. This portion is referred to hereafter as SLS-MP and has the two signal levels L/L. As the MP is transported through the spiral due to the revolutions that occur, the SLS-MP is also bijectively repositioned within the SLS (see FIG. 9). It is possible to bijectively count three revolutions using the sensor element according to the illustrated example from FIG. 7.

Figure 8:
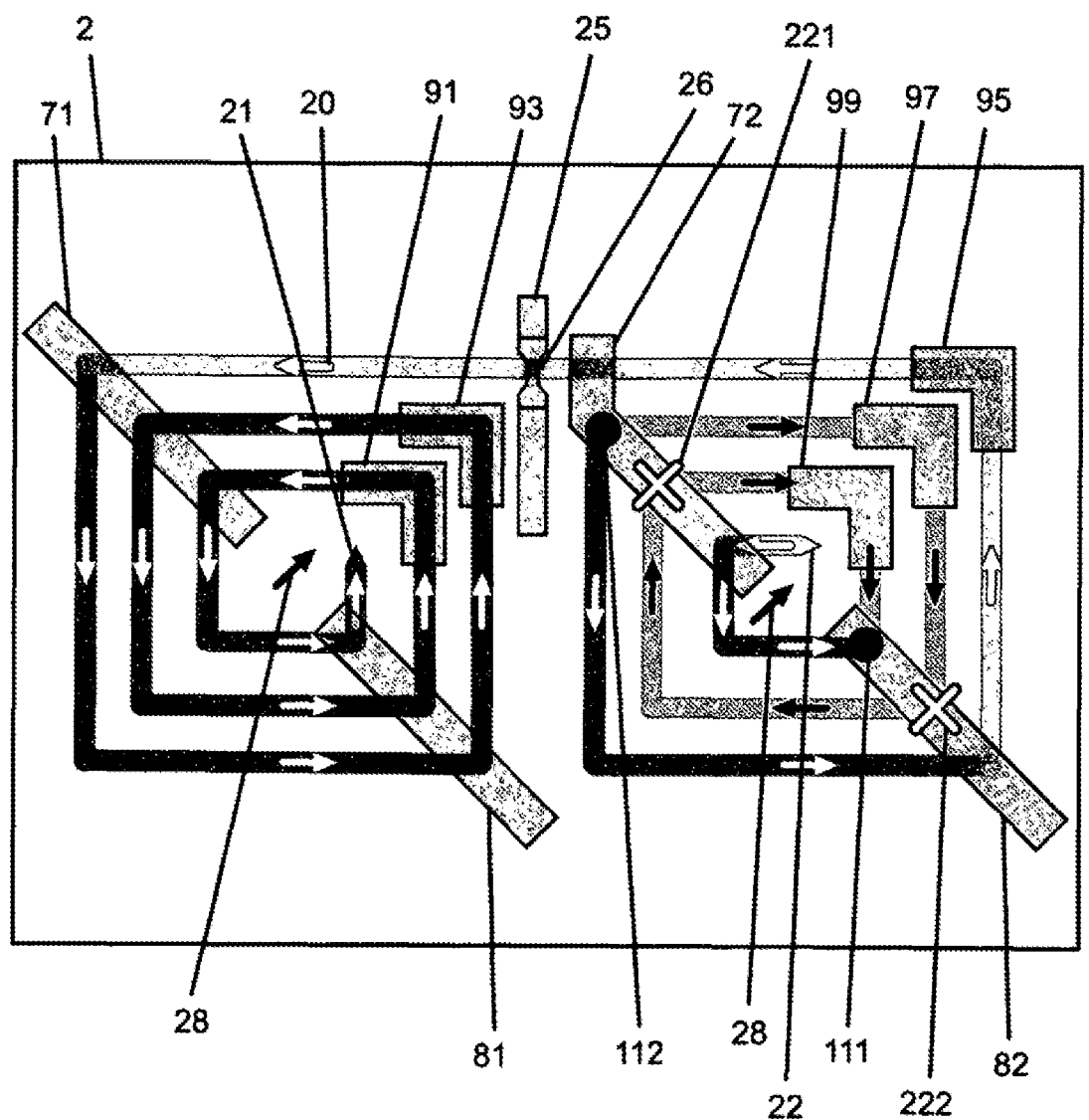
FIG. 8 shows the domain wall position according to FIG. 7 after three revolutions of the outer magnetic field.

For illustration, FIG. 8 shows the domain wall position after three cw revolutions. The DW 111 and the DW 112 and the interposed DW gaps DWL 221 and DWL 222 were transported twelve DW positions, which is to say three windings, further, and more particularly into the positions shown in FIG. 8. The positions of the DW 111 and DW 112 thus represent revolution number three. The magnetization direction of the webs in the WHB4 and the WHB5 is ccw, and that of the webs in the WHB1, the WHB2 and the WHB3 is cw, again indicated here by arrows on the domain wall conductors. The signal levels of the Wheatstone half bridges after three 360° revolutions are:

WHB1 (winding 1): H
WHB2 (winding 2): H
WHB3 (winding 3): H
WHB4 (winding 4): L
WHB5 (winding 5): L The SLS after three revolutions is thus H/H/H/L/L. Compared to the SLS of FIG. 7 (L/L/H/H/H), the SLS-MP having the levels UL has been transported one position further to the right within the SLS with each counted revolution. This correlates with the further transport of the domain walls DW 111 and DW 112 into the next winding with each counted revolution. Designing the sensor element 2 in the form of two sub-spirals having the same winding direction of rotation has the advantage that it is possible to design the overall spiral to be smaller, for example compared to a design according to FIG. 3, and thereby reduced the required chip surface.

FIG. 9 is intended to help illustrate the evaluation and assessment of the signal level sequences that have been ascertained during the count, in keeping with the impressed domain wall pattern in correlation with each quadrant, and have been stored, and essentially illustrates the evaluation method according to the invention in more detail, based on the example according to FIGS. 7 and 8.

FIG. 9 shows the target value signal level sequences for the revolutions 0, 1, 2 and 3 for the five windings W1 to W5 according to FIG. 7 for the sensor element from FIG. 7 and FIG. 8 in tabular form, for the field angle quadrant 1 (FIG. 9a), the field angle quadrant 2 (FIG. 9b), the field angle quadrant 3 (NG. 9c) and the field angle quadrant 4 (FIG. 9d) predefined by the quadrant sensor or angle sensor 3. For the specific sensor used, a bijective pattern thus always exists. For each quadrant, a dedicated significant SLS-MP exists, and a respective dedicated bijective SLS exists for each revolution. The significant SLS-MP for quadrant Q1 is for Q2 it is M/L, for Q3 it is L, and for Q4 it is L, wherein H denotes a high, M a medium, and L a low Wheatstone half bridge signal level. The above-described significant SLS-MP are each highlighted in medium or dark gray in the tables of FIG. 9. As a result, at least one sub-table comprising all SLSs for all permissible (which is to say countable) revolutions is kept available according to the invention for each individual quadrant, which are listed by way of example in FIGS. 9a to 9d. The processing unit 11 first determines the field angle quadrant in which the system is presently located, which is to say the position of the rotating element 4 (according to FIG. 1, for example). Following this determination, the processing unit 11 searches the sub-table associated with the selected quadrant, and thereafter compares the measured SLS to the SLS target values of the corresponding quadrant. In the example, this would be the quadrant 1 (FIG. 9a) By comparing the measured values in the memory 9 to the target value signal level sequences kept available in the memory 10, from this sub-table the processing unit 11 immediately thereafter ascertains the associated revolution number (agreement of the SLSs), which can then be output/displayed. In the example, the signal level sequence according to FIG. 7 corresponds to the revolution number zero, and the signal level sequence according to FIG. 8 corresponds to the revolution number three, as is easily apparent from a comparison to the above description. If a different field angle quadrant predefines the selection of the associated sub-table, the procedure is analogous.

Figure 10:
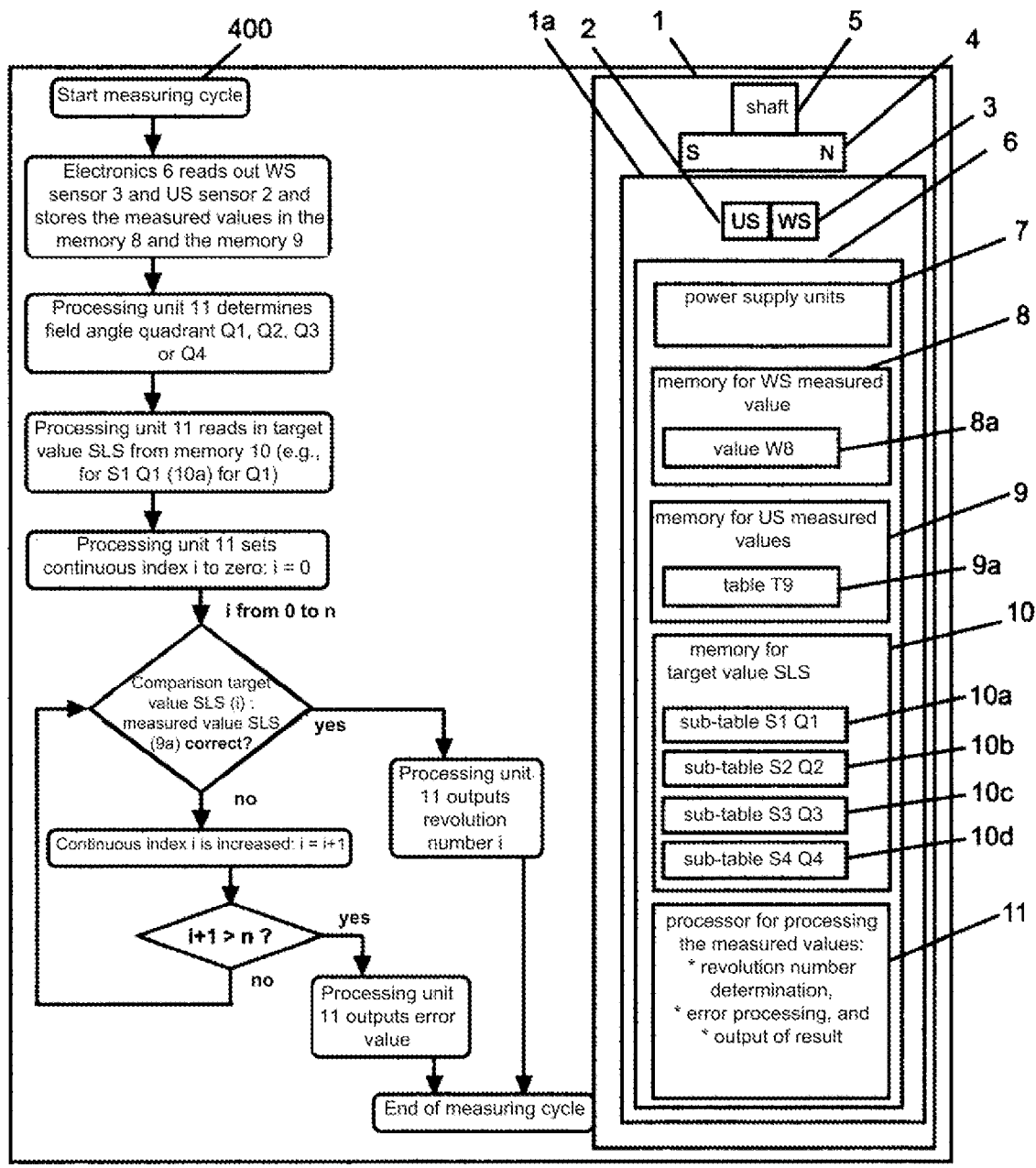
FIG. 10 shows a flow chart of the procedure of determining a revolution correlated with the associated assemblies.

FIG. 10 schematically shows the determination of the revolution number in a flow chart 400 when the revolution counter system 1 ascertains an arbitrary, but unknown revolution number.

After the start of the measuring cycle,
the electronics 6, in the first step, reads out the angle sensor (WS) 2 and the revolution number sensor (US) 3, and stores the values in the memories 8 and 9 as the value W8 (8a) and the table T9 (9a);
in step 2, the processing unit 11 ascertains the associated field angle quadrant Q1, Q2, Q3 or Q4 from the angle sensor measured value W8 (8a);
for the ascertained quadrant (such as Q1), in step 3 the sub-table for the ascertained quadrant (such as sub-table S1 Q1 (10a)) is loaded from the memory 10 comprising the target value signal level tables for the permissible revolutions i (0≤i≤n);
in step 4, the processing unit 11 sets the continuous index i to 0;
step 5 is an iterative comparison by the processing unit 11 between the measured SLS in the table T9 (9a) and the target value SLS (for example, from sub-table S1 Q1 (10a)) for the revolution i:
if the values agree, the processing unit 11 in step 6 outputs the revolution number i, or if the values do not agree, the continuous index i is increased by one in step 6, and in step 7 it is checked whether i>n:
if i>n, the processing unit 11 in step 8 outputs an error value;
otherwise step 5 is repeated for the revolution i+1.

The measuring cycle is completed with the output of a revolution number or of an error value. An error value is only output if no agreements whatsoever can be observed between the measured signal level sequences and those stored as the target values. This is synonymous with the domain wall pattern impressed into the revolution sensor having changed due to external conditions, such as excessive external disturbance magnetic fields and the like. In such an extremely rare case, the desired magnetization pattern would have to be re-written into the revolution sensor 2.

The entire procedure of determining countable revolution numbers by way of the above-described electronic components takes place over times that are substantially shorter than those during which the direction of the outer magnetic field acting on the revolution sensor 2 has changed. Typically, the measurement and evaluation of an SLS takes place using MHz clock frequencies (which is to say within one µs), while the magnetic field is rotating at a maximum of 1 KHz. In one µs, the direction of the magnetic field thus rotates by a maximum of 0.3°. As a result of these high evaluation speeds, it is also possible to display the found revolution numbers, which during the currentless operation shifted the magnetization pattern in the sensor 2, in several 10 ns to a maximum of 1 µs.

While all assemblies essential to the invention are contained in the actual revolution counter, which is enclosed in a frame-like manner in FIG. 1 and denoted by reference numeral 1a, figures hereafter shall illustrate the broad field of application of the solution according to the invention.

Figure 11:
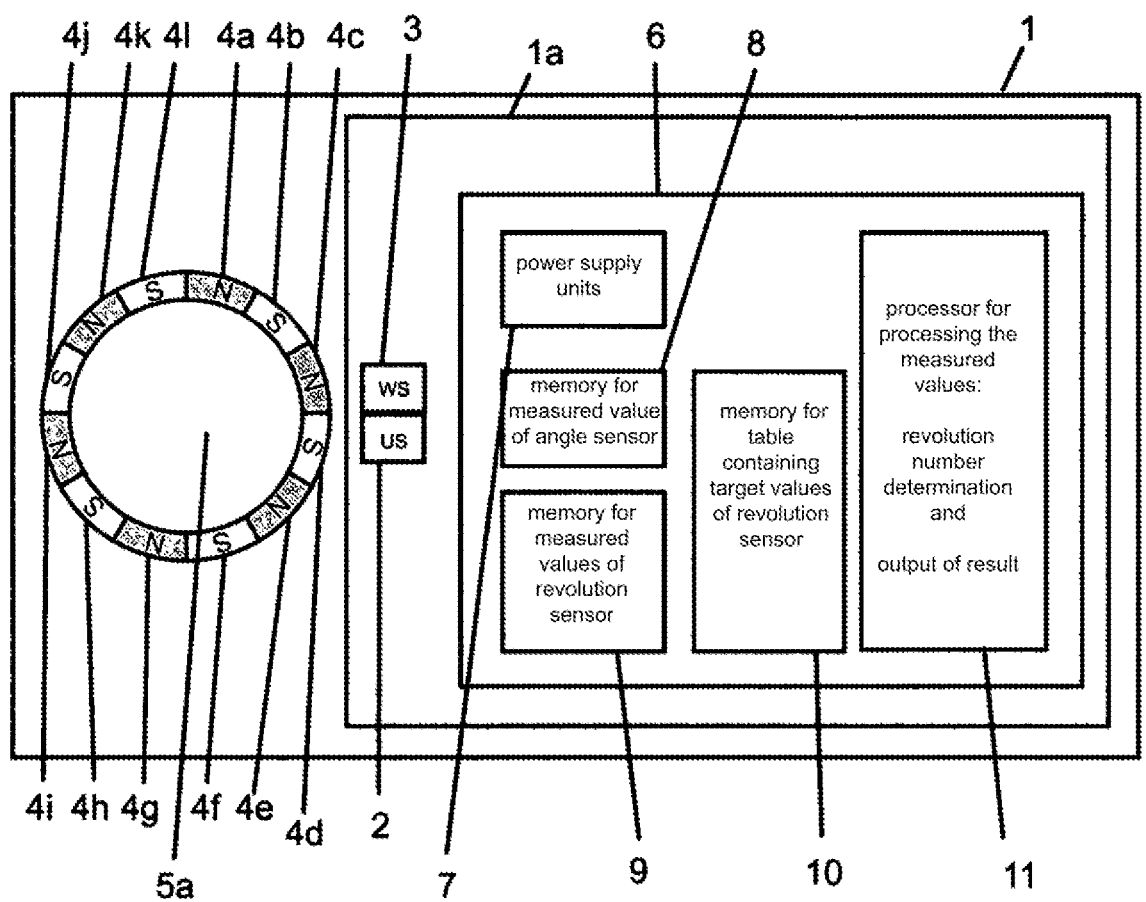
FIG. 11 shows a revolution counter according to FIG. 1 combined with a magnet wheel.

FIG. 11, for example, shows the revolution counter 1a from FIG. 1 combined with a magnet wheel 5a comprising magnetic poles 4a to 4l instead of a magnet 4 on a shaft 5 according to FIG. 1. When the magnet wheel 5a is rotated, it generates a magnetic rotating field at the location of the angle sensor WS 3 and of the revolution sensor US 2 which moves the domain walls of the magnetization pattern in the sensor element 2. Each magnet wheel position thus corresponds to an angle sensor measured value and a revolution counter measured value. The revolution counter counts the number of the magnetic pole pairs that are moved past. This is analogous to the counting of revolutions of the magnet 4 according to FIG. 1.

Figure 12:
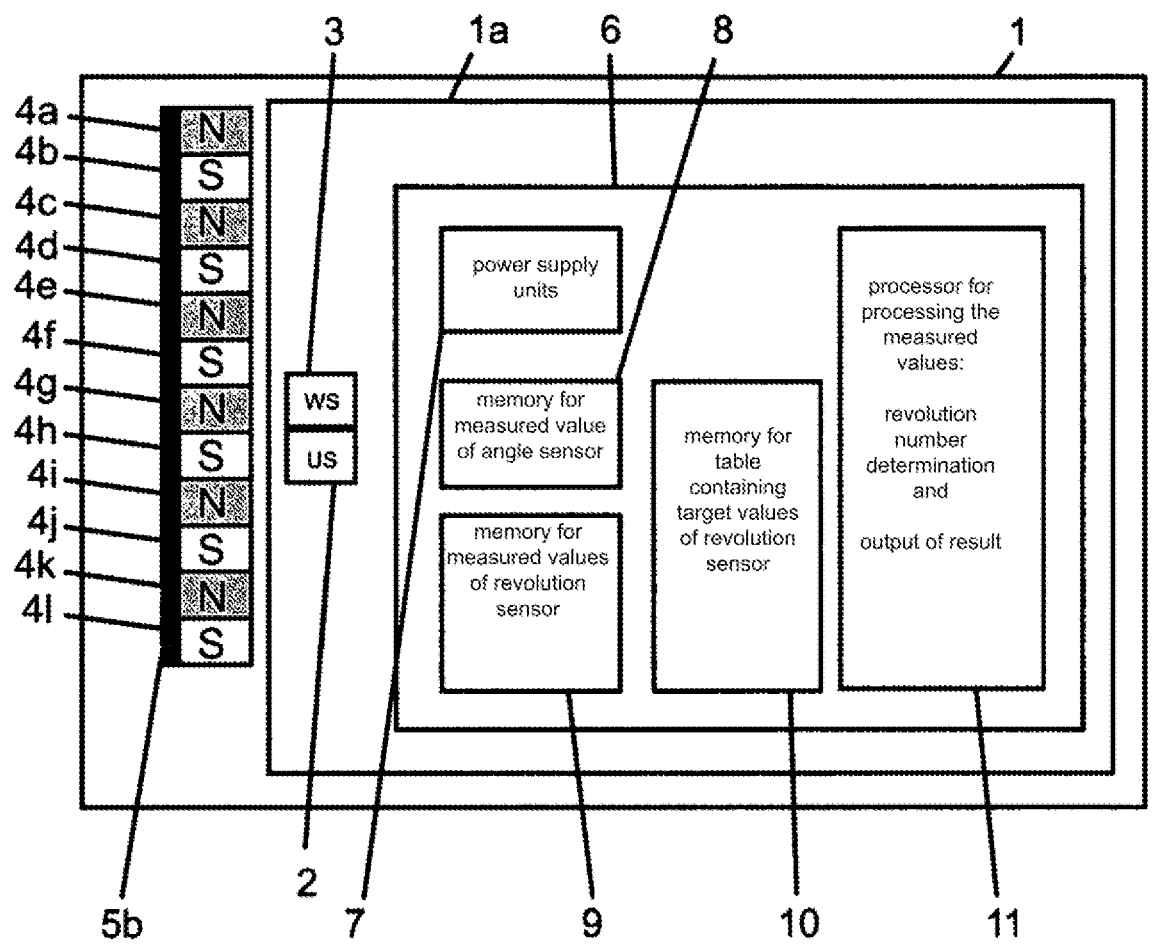
FIG. 12 shows a revolution counter according to FIG. 1 combined with a linear scale.

FIG. 12 shows the revolution counter 1a from FIG. 1 combined with a linear scale 5b comprising magnetic poles 4a to 4l instead of a magnet 4 on a shaft 5 according to FIG. 1. The linear scale 5b comprising twelve magnetic poles in the example (6 magnetic north poles alternatingly with 6 magnetic south poles) 4a to 4l also represents other linear scales having more or fewer magnetic poles. When the scale 5b is moved past relative to the revolution counter 1a, the scale generates a magnetic rotating field at the location of the angle sensor WS 3 and of the revolution sensor US 2, which moves the domain walls of the impressed magnetization pattern in the sensor element 2. Each scale position thus corresponds to an angle sensor measured value and a revolution counter measured value. The revolution counter counts the number of the magnetic pole pairs that are moved past. This is analogous to the counting of revolutions of the magnet 4 according to FIG. 1.

Figure 13A:
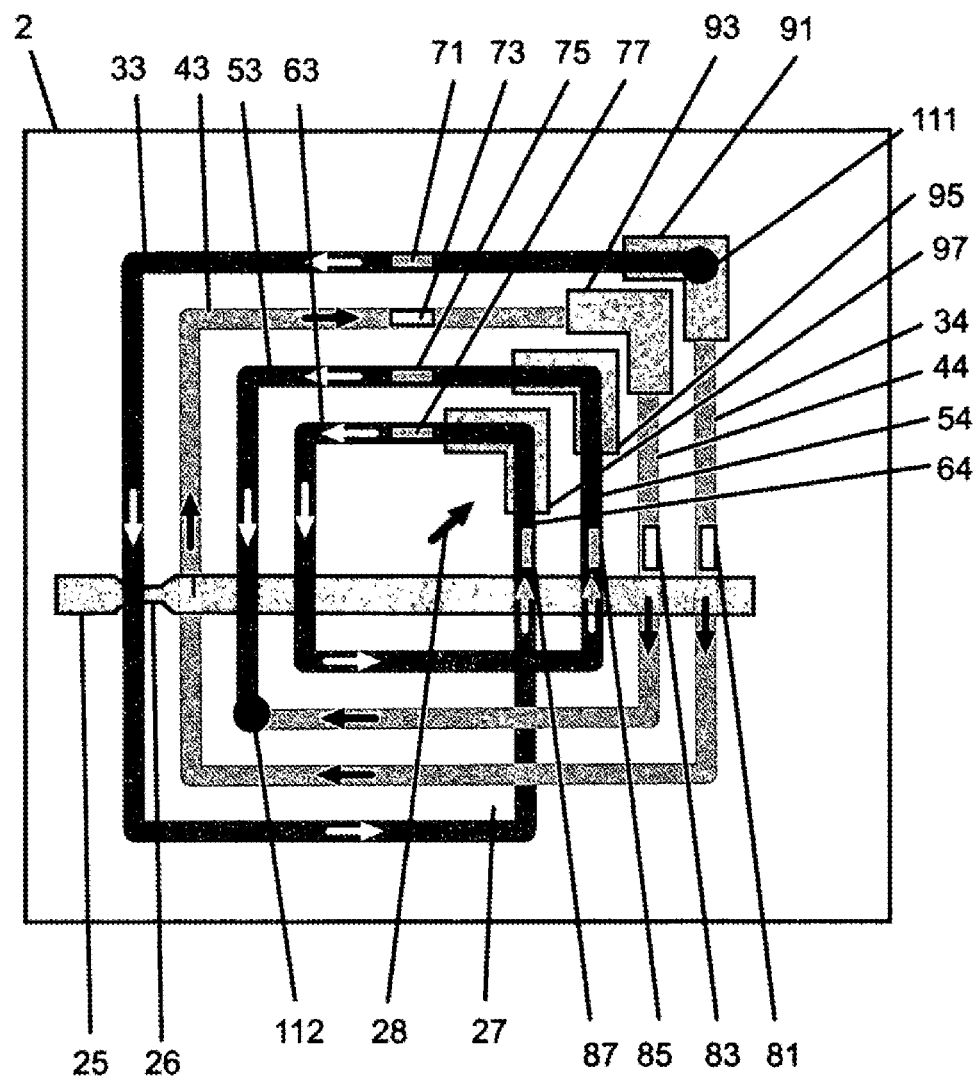
FIGS. 13a and 13b, by way of example, show a design according to FIG. 4, here comprising TMR contacts and the 360° contacting according to the invention.

Finally, FIGS. 13a+b, by way of example, show the use of a sensor element 2 comprising TMR contacts having the "360° contacting" according to the invention. The spiral 27 is made of a soft magnetic material, such as permalloy, in this case.

FIG. 13a shows an exemplary four-turn, closed loop 27 in a top view. The sensor element 2 is read out by way of potential measurements using four Wheatstone half bridges WHB1 to WHB4:

WHB1 is composed of the web 33 comprising the GND tunneling contact 71, and the web 34 comprising the VCC tunneling contact 81 and the center contact 91, which covers the quarter circle-shaped corner between the web 33 and the web 34 and parts of these webs.

WHB2 is composed of the web 43 comprising the GND tunneling contact 72, and the web 44 comprising the VCC tunneling contact 82 and the center contact 93, which covers the quarter circle-shaped corner between the web 43 and the web 44 and parts of these webs.

WHB3 is composed of the web 53 comprising the GND tunneling contact 73, and the web 54 comprising the VCC tunneling contact 83 and the center contact 95, which covers the quarter circle-shaped corner between the web 53 and the web 54 and parts of these webs.

WHB4 is composed of the web 63 comprising the GND tunneling contact 74, and the web 64 comprising the VCC tunneling contact 84 and the center contact 97, which covers the quarter circle-shaped corner between the web 63 and the web 64 and parts of these webs. (Reference numerals not denoted in FIG. 13a are apparent from FIG. 14).

Figure 13B:
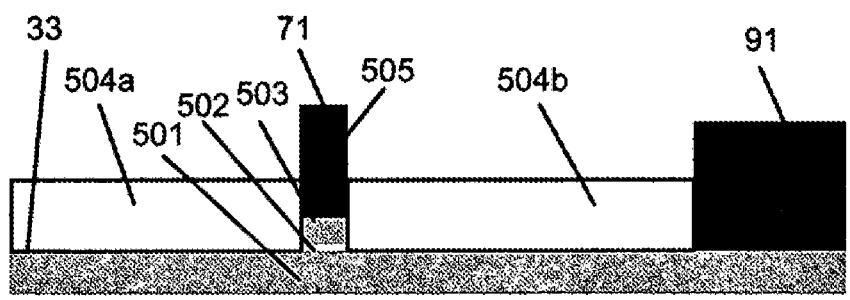

FIG. 13b shows the web 33 in a lateral section through FIG. 13a representatively for all webs comprising a tunneling contact. The web 33 is made of a soft magnetic material 501, for example permalloy, and protected with an oxide layer 504a and 504b. The GND tunneling contact 71 is positioned in the web center. The tunneling contact comprises a permalloy layer 501, a tunnel barrier 502 (such as $Al_2O_3$ or MgO), a hard magnetic layer stack 503, into which the reference direction (28 in FIG. 13a) is written, and a gold electrode 505. The center contact 91, which is made of gold, is located directly on the permalloy 501 on the right of the web 33. The flow of current on the tunneling contact takes place from the electrode 505, through the hard magnetic layer stack, and through the barrier 502, into the permalloy 501. Typical TMR contacts reach changes in resistance of >100% between a parallel and an anti-parallel magnetization of the soft magnetic and the hard magnetic layers in the TMR contact, which is to say as a function of the respective position of the domain walls 111, 112. The initialization of the domain wall pattern according to the invention, and the evaluation and the determination of the present revolution number, in this example take place analogously to the proviso already described with respect to FIG. 5 and others and consequently need not be repeated here.

Figure 14:
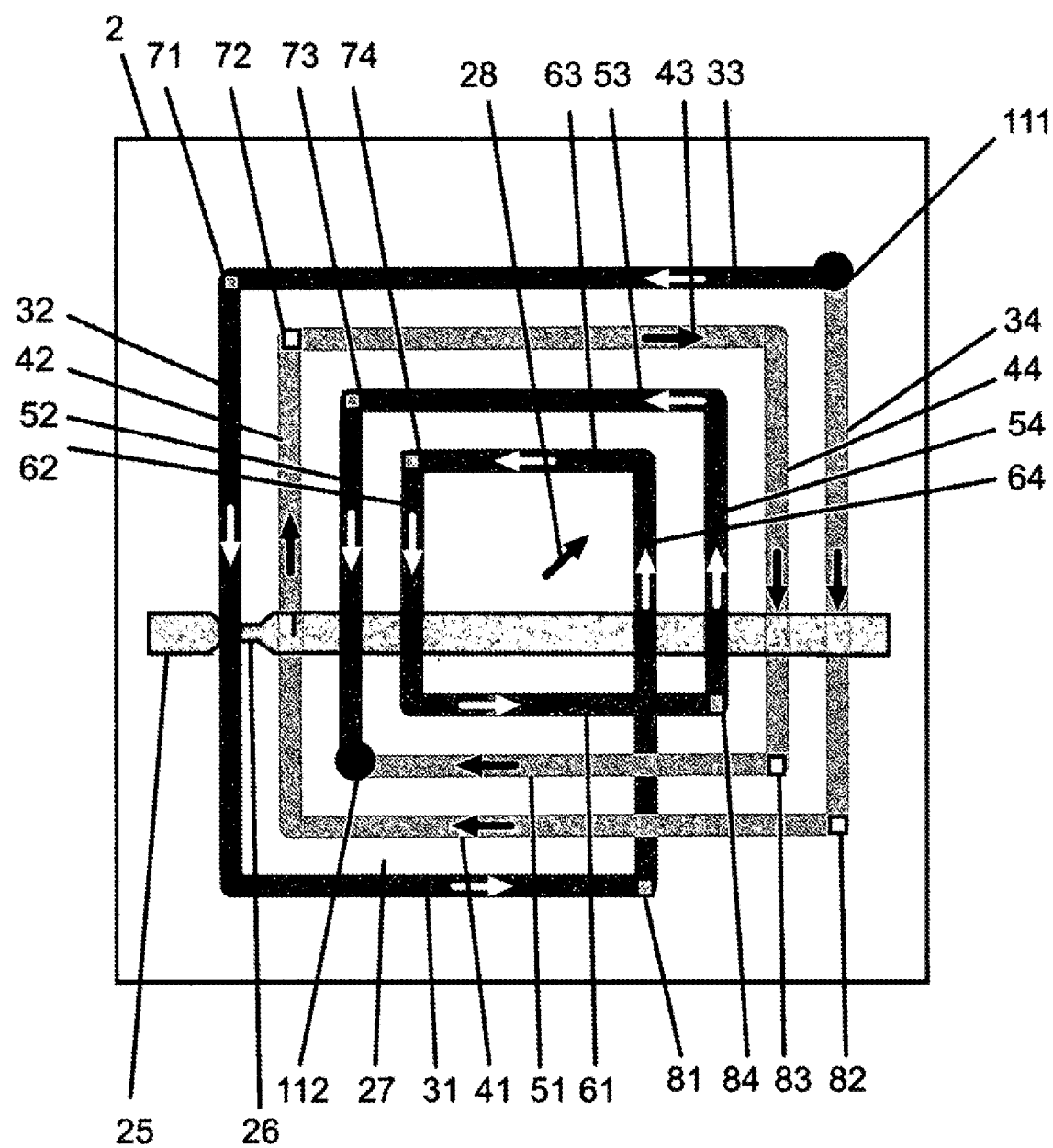
FIG. 14 shows the sensor element of FIG. 13a having a contact arrangement according to the invention for resistance measurement.

FIG. 14 shows the revolution sensor from FIG. 13a having modified contacting in which the resistances are read out. This loop is electrically contacted with the GND contacts 71, 72, 73 and 74, and the VCC contacts 81, 82, 83 and 84, a respective GND contact and a respective VCC contact being located on one winding. So as to utilize the TMR effect, the VCC contacts, for example, must contact the respective soft magnetic layer, and the GND contacts must contact the respective hard magnetic layer (analogous to FIG. 13b, in which the center contact 91 contacts the soft magnetic layer 501, and the GND tunneling contact 71 contacts the hard magnetic layer), or vice versa. Deviating from FIG. 14, the contacts may be positioned on the webs, instead of over the corners, and preferably on opposing webs. For example, the VCC contacts 81, 82, 83 and 84 can be positioned on the webs 31, 41, 51 and 61, and the GND contacts 71, 72, 73 and 74 can be positioned on the webs 33, 43, 53 and 63.

The magnetization state of the sensor element is read out by way of resistance measurement of each individual winding here:

The outer, first winding W1 is formed by the webs 31, 32, 33 and 34 comprising the GND contact 71 and the VCC contact 81.

The second winding W2 is formed by the webs 41, 42, 43 and 44 comprising the GND contact 72 and the VCC contact 82.

The third winding W3 is formed by the webs 51, 52, 53 and 54 comprising the GND contact 73 and the VCC contact 83.

The fourth, innermost winding W4 is formed by the webs 61, 62, 63 and 64 comprising the GND contact 74 and the VCC contact 84.

In this example as well, the separation between the two neighboring domain walls DW 111 and DW 112 is 540°, as viewed in the cw direction.

All features discernible from the description, the exemplary embodiments and/or the following drawings can be essential to the invention, both individually and in any arbitrary combination with each other.

LIST OF REFERENCE NUMERALS 1 revolution counter system
1a revolution counter
2 revolution sensor US
3 angle sensor WS
4 magnetic system
4a, 4c, 4e 4g, 4i 4k magnetic north poles
4b, 4d, 4f, 4h, 4j, 4l magnetic south poles
5 rotating shaft
5a magnet wheel
5b linear scale
6 electronics
7 power supply units
8 memory for the measured value of the angle sensor
8a measured value W8 of the angle sensor
9 memory for the measured values of the revolution sensor
9a table T9 containing measured values of the revolution sensor
10 memory for target value SLS (signal level sequences) of the revolution sensor stored in tabular form
10a-10d sub-tables containing target values for field angle quadrants 1 to 4
11 processing unit
20 spiral
21, 22 pointed ends of a spiral
25 conductor for initializing a magnetization pattern
26 constriction in conductor 25
27 multiply-wound, closed loop
28 direction of the reference magnetization
31, 32, 33, 34 webs of the outermost, first winding
35, 36, 37, 38 DW positions in the outermost, first winding
41, 42, 43, 44 webs of the second winding
45, 46, 47, 48 DW positions in the second winding
51, 52, 53, 54 webs of the third winding
55, 56, 57, 58 DW positions in the third winding
63, 64 webs of the fourth winding
65 DW position in the fourth winding
70, 71, 72, 73, 74 GND contacts
80, 81, 82, 83, 84 VCC contacts
91, 93, 95, 97, 99 center contacts of the different windings
111a 1st DW with an MP including 1 DW
111 1st DW with an MP including 2 or 6 domains walls
112 2nd DW with an MP including 2 or 6 domains walls
113 3rd DW with an MP including 6 domains walls
114 4th DW with an MP including 6 domains walls
115 5th DW with an MP including 6 domains walls
116 6th DW with an MP including 6 domains walls
133 resistor R33 (web 33) in the first winding
134 resistor R34 (web 34) in the first winding
143 resistor R43 (web 43) in the second winding
134 resistor R44 (web 44) in the second winding
153 resistor R53 (web 53) in the third winding
154 resistor R54 (web 54) in the third winding
163 resistor R63 (web 63) in the fourth winding
164 resistor R64 (web 64) in the fourth winding
202 chip comprising sensor element 2
221, 222 DW gaps
225a first bond contact connected to contact 25
225b second bond contact connected to contact 25
233 external resistor Rref33 for first winding
234 external resistor Rref34 for first winding
243 external resistor Rref43 for second winding
244 external resistor Rref44 for second winding
253 external resistor Rref53 for third winding
254 external resistor Rref54 for third winding
263 external resistor Rref63 for fourth winding
264 external resistor Rref64 for fourth winding
270 bond contact connected to GND contact 70
280 bond contact connected to VCC contact 80
291 bond contact connected to center contact 91
293 bond contact connected to center contact 93
295 bond contact connected to center contact 95
297 bond contact connected to center contact 97
301 zoomed-in corner between web 51 and web 44
302 quarter circle-like polygonal line
400 flow chart
501 soft magnetic layer
502 tunnel barrier
503 hard magnetic layer stack
504a insulating layer
504b insulating layer
505 gold electrode on tunneling contact

The invention claimed is:

1. A magnetic revolution counter for determining a predefinable number n of revolutions to be determined of an outer magnetic field, comprising a revolution sensor and a magnetic system configured to generate a rotating magnetic field and comprising an element comprising a pair of magnetic poles mounted to be rotatable about an axis situated between the magnetic poles, or a rotatable magnetic wheel comprising a plurality of magnetic poles situated around an axis of rotation of the magnetic wheel, or a linear scale comprising a plurality of magnetic poles and arranged to be movable in directions of a length of the linear scale, wherein the magnetic system is arranged relative to the revolution sensor so that the rotating magnetic field moves past the revolution sensor whereby the revolution sensor senses the rotation of the rotating magnetic field, and wherein the revolution sensor includes magnetic domain wall conductors composed of at least one open spiral or closed, multiply-wound loops, which are formed by a GMR (giant magnetoresistive) layer stack or a soft magnetic layer comprising locally present TMR (tunnel magnetoresistive) layer stacks and in which magnetic 180° domain walls can be introduced and located by measuring the electrical resistance of predefined spiral or loop sections, wherein a single domain wall is, or at least two magnetic domain walls are, introduced into the domain wall conductors and the at least two domain walls, by way of means for generating, pinning or deleting, in a defined manner, domain walls, are brought into a defined separation of greater than 360° with respect to one another, based on a change in location thereof from a first to a second position, with a rotation of the rotating magnetic field by the angle of greater than 360°, and are permanently thus spaced apart from one another, and electrical contacts, comprising GND (ground) contacts, VCC (higher voltage relative to ground) and additional contacts, are provided on the domain wall conductors such that the domain wall conductors, located diagonally opposed, are captured by a respective GND contact and VCC contact collectively, or in VCC contact groups and GND contact groups with a multiplex read-out, and additional contacts are provided on each individual domain wall conductor section solely on one side and substantially centered between the GND contacts and VCC contacts, or, with a multiplex read-out, in groups of contacts that contact a plurality of windings as Wheatstone half bridge center contacts, and said electrical contacts, together with associated domain wall conductor sections captured thereby, are interconnected to form the Wheatstone half bridges that are separate from each other, but can be read out together, wherein the electrical resistance conditions ascertained by the Wheatstone half bridges are all stored as a signal level in a first memory in the form of a table, which for the determination of a present revolution number can be continuously compared to sub-tables of target value patterns stored in a second memory for each permissible revolution i (0≤i≤n), and a processing unit is provided for determining for output the revolution number i for which the measured electrical resistance conditions in the table in the first memory agree with the target value pattern in the second memory.

2. A magnetic revolution counter for determining a predefinable number n of revolutions to be determined of an outer magnetic field, comprising a revolution sensor and a magnetic system configured to generate a rotating magnetic field and comprising an element comprising a pair of magnetic poles mounted to be rotatable about an axis situated between the magnetic poles, or a rotatable magnetic wheel comprising a plurality of magnetic poles situated around an axis of rotation of the magnetic wheel, or a linear scale comprising a plurality of magnetic poles and arranged to be movable in directions of a length of the linear scale, wherein the magnetic system is arranged relative to the revolution sensor so that the rotating magnetic field moves past the revolution sensor whereby the revolution sensor senses the rotation of the rotating magnetic field, and wherein the revolution sensor includes magnetic domain wall conductors composed of at least one open spiral or closed, multiply-wound loops, which are formed by a GMR (giant magnetoresistive) layer stack or a soft magnetic layer comprising locally present TMR (tunnel magnetoresistive) layer stacks and in which magnetic 180° domain walls can be introduced and located by measuring the electrical resistance of predefined spiral or loop sections, wherein a single domain wall is, or at least two magnetic domain walls are, introduced into the domain wall conductors and the at least two domain walls, by way of means for generating, pinning or deleting, in a defined manner, domain walls, are brought into a defined separation of greater than 360° with respect to one another, based on the change in location thereof from a first to a second position, with a rotation of the outer magnetic field by the angle of greater than 360°, and are permanently thus spaced apart from one another, and electrical contacts comprising GND (ground) contacts, VCC (higher voltage relative to ground) and additional contacts, are provided on the domain wall conductors such that the domain wall conductors, located diagonally opposed, are captured by a respective GND contact and a respective VCC contact per winding or, with a multiplex read-out, are captured by a shared GND contact and a respective VCC contact per winding, or by a shared VCC contact and a respective GND contact per winding, and the electrical resistance conditions ascertained by way of these contacts are all stored as a signal level in a first memory in the form of a table, which for the determination of the present revolution number can be continuously compared to tabular target value patterns stored in a second memory for each permissible revolution i (0≤i≤n), and a processing unit is provided for determining for output the revolution number i for which the measured electrical resistance conditions in the table in the first memory agree with the target value pattern in the second memory.

3. The magnetic revolution counter according to claim 1, further comprising a rotation angle sensor, or a quadrant sensor, wherein a signal of the rotation angle sensor, or of the quadrant sensor, determines the sub-table in the second memory to which the measured resistance conditions in the table of the first memory are compared.

4. The magnetic revolution counter according to claim 1, wherein the at least one open spiral or the closed, multiply-wound loops forming the domain wall conductors each have a substantially rhombus shape, wherein said electrical contacts capture the corner regions of the rhombuses.

5. The magnetic revolution counter according to claim 1, wherein the defined separation between the at least two neighboring domain walls is established at 540°.

6. The magnetic revolution counter according to claim 1, wherein the domain wall conductors are formed by open spirals both ends of which are pointed.

7. The magnetic revolution counter according to claim 1, wherein the means for generating, pinning or deleting domain walls, in a defined manner, are formed by an additional conductor, which captures at least one winding of the domain wall conductor and is tapered at a contact point bridging the domain wall conductor and which ensures that an Oersted field having a sufficient magnitude is generated when a current is applied.

8. A method for determining integral revolution numbers by using a magnetic revolution counter according to claim 1, comprising first impressing a domain pattern including only a single domain wall or having a defined separation of domain walls into the domain wall conductors, wherein the separation of at least two neighboring domain walls is established at greater than 360°, based on a change in location thereof from a first to a second position, with a rotation of the rotating magnetic field by an angle of greater than 360°, and corresponding to the impressed domain wall pattern, storing all signal level target values to be expected from the Wheatstone half bridges or domain wall conductors as the sub-tables of target value patterns in the second memory for all possible fall 360° revolutions (0≤i≤n) ascertainable by way of the magnetic revolution counter and all associated changed domain wall positions, and storing all the associated values of the revolution sensor presently ascertained by the Wheatstone half bridges or domain wall conductors during the present count in the table in the second memory, and continuously comparing the measured values in the table in the first memory to the respective signal level target values in the second memory, and wherein the ascertained revolution number i is output when the tabular values in the two memories agree with one another.

9. The method according to claim 8, wherein the apparatus further comprises a rotation angle sensor or a quadrant sensor, signal level target values are stored in at least four said sub-tables for four field angle quadrants in the second memory for each individual revolution i countable by way of the revolution counter, the measured value from the angle sensor, or from the quadrant sensor, determines which table of said sub-tables to which signal levels in the table of the first memory are continuously compared so as to ascertain the associated revolution number.

10. The magnetic revolution counter according to claim 2, further comprising a rotation angle sensor, or a quadrant sensor, wherein a signal of the rotation angle sensor, or of the quadrant sensor, determines the sub-table in the second memory to which the measured resistance conditions in the table of the first memory are compared.

11. The magnetic revolution counter according to claim 2, wherein the at least one open spiral or the closed, multiply-wound loops forming the domain wall conductors each have a substantially rhombus shape, wherein said electrical contacts capture the corner regions of the rhombuses.

12. The magnetic revolution counter according to claim 2, wherein the defined separation between the at least two neighboring domain walls is established at 540°.

13. The magnetic revolution counter according to claim 2, wherein the domain wall conductors are formed by open spirals both ends of which are pointed.

14. The magnetic revolution counter according to claim 2, wherein the means for generating, pinning or deleting domain walls, in a defined manner, are formed by an additional conductor, which captures at least one winding of the domain wall conductor and is tapered at a contact point bridging the domain wall conductor and which ensures that an Oersted field having a sufficient magnitude is generated when a current is applied.

15. A method for determining integral revolution numbers by using a magnetic revolution counter according to claim 2, comprising first impressing a domain pattern including only a single domain wall or having a defined separation of domain walls into the domain wall conductors, wherein the separation of at least two neighboring domain walls is established at greater than 360°, based on a change in location thereof from a first to a second position, with a rotation of the rotating magnetic field by an angle of greater than 360°, and corresponding to the impressed domain wall pattern, storing all signal level target values to be expected from the Wheatstone half bridges or domain wall conductors as the sub-tables of target value patterns in the second memory for all possible full 360° revolutions (0≤i≤n) ascertainable by way of the magnetic revolution counter and all associated changed domain wall positions, and storing all the associated values of the revolution sensor presently ascertained by the Wheatstone half bridges or domain wall conductors during the present count in the table in the second memory, and continuously comparing the measured values in the table in the first memory to the respective signal level target values in the second memory, and wherein the ascertained revolution number i is output when the tabular values in the two memories agree with one another.

16. The method according to claim 15, wherein the apparatus further comprises a rotation angle sensor or a quadrant sensor, signal level target values are stored in at least four said sub-tables for four field angle quadrants in the second memory for each individual revolution i countable by way of the revolution counter, and the measured value from the angle sensor, or from the quadrant sensor, determines which table of said sub-tables to which signal levels in the table of the first memory are continuously compared so as to ascertain the revolution number.

\* \* \* \* \*